US 9,479,383 B2

United States Patent
Bhaskar et al.

(10) Patent No.: US 9,479,383 B2
(45) Date of Patent: Oct. 25, 2016

(54) DATA COMPRESSION FOR PRIORITY BASED DATA TRAFFIC, ON AN AGGREGATE TRAFFIC LEVEL, IN A MULTI STREAM COMMUNICATIONS SYSTEM

(71) Applicant: Hughes Network Systems, LLC, Germantown, MD (US)

(72) Inventors: Udaya Bhaskar, North Potomac, MD (US); Douglas Dillon, Gaithersburg, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 190 days.

(21) Appl. No.: 14/215,043

(22) Filed: Mar. 16, 2014

(65) Prior Publication Data

US 2014/0223030 A1 Aug. 7, 2014

Related U.S. Application Data

(63) Continuation-in-part of application No. 13/180,969, filed on Jul. 12, 2011, now abandoned.

(60) Provisional application No. 61/787,257, filed on Mar. 15, 2013.

(51) Int. Cl.
| | | |
|---|---|---|
| *G06F 7/00* | (2006.01) | |
| *H04L 29/06* | (2006.01) | |
| *H03M 7/30* | (2006.01) | |
| *H03M 7/40* | (2006.01) | |

(52) U.S. Cl.
CPC ........ *H04L 29/0604* (2013.01); *H03M 7/3088* (2013.01); *H03M 7/4006* (2013.01); *H04L 65/608* (2013.01)

(58) Field of Classification Search
None
See application file for complete search history.

(56) References Cited

U.S. PATENT DOCUMENTS

| | | | |
|---|---|---|---|
| 4,814,746 A | 3/1989 | Miller et al. | |
| 5,426,779 A * | 6/1995 | Chambers, IV | .... G06F 12/0802 |
| 5,541,995 A | 7/1996 | Normile et al. | |
| 5,627,534 A | 5/1997 | Craft | |
| 6,624,762 B1 | 9/2003 | End | |
| RE41,152 E | 2/2010 | Reynar et al. | |
| 7,840,744 B2 | 11/2010 | Bellows et al. | |

(Continued)

OTHER PUBLICATIONS

USPTO, "International Search Report & Written Opinion", PCT App. No. PCT/US2014/030110, Aug. 7, 2014.

(Continued)

*Primary Examiner* — David H Malzahn
(74) *Attorney, Agent, or Firm* — Potomac Technology Law, LLC

(57) ABSTRACT

An approach for multi-stream data compression comprises receiving packets of a data stream, wherein the packets comprise respective packets of source data streams compressed on an aggregate basis and in a successive order. A one of the packets is decompressed, and a determination is made whether the packet has been received in a proper order of succession compared to the successive order of compression. When it is determined that the packet has been received in the proper order, the packet is stored at a next location in a decompressor cache. When it is determined that the packet has not been received in the proper order, the packet is stored at a location in the decompressor cache, allowing for subsequent storage of one or more further packets in the proper order of succession, wherein the further packets were processed via the compression process before, but were received after, the one packet.

20 Claims, 12 Drawing Sheets

(56) References Cited

U.S. PATENT DOCUMENTS

| | | |
|---|---|---|
| 2009/0006510 A1 | 1/2009 | Laker et al. |
| 2009/0060047 A1 | 3/2009 | Schneider |
| 2012/0047283 A1 | 2/2012 | Plamondon |
| 2013/0018932 A1 | 1/2013 | Bhaskar et al. |
| 2013/0041934 A1 | 2/2013 | Annamalaisami et al. |
| 2014/0223029 A1 | 8/2014 | Bhaskar et al. |
| 2014/0223030 A1* | 8/2014 | Bhaskar ............ H03M 7/3088 709/247 |

OTHER PUBLICATIONS

Bar-Ness, Yeheskel et al., "String Dictionary Structure for Markov Arithmetic Encoding", IEEE International Conference on Communications, 1988, XP002672031, 1988.

ESR P1078EPOO, "European Search Report", Jan. 16, 2013.

Williams, Ross, "LZRW3-A.C", XP002672032, http://www.ross.net/compression/download/original/old_lzrw3-a.c, Aug. 2, 1991, pp. 1-13.

Williams, Ross, "Notes From the Comp. Compression FAQ", XP002672021, http://www.ross.net/compression/patents_notes_from_ccfaq.html, Mar. 21, 1996.

Yang, En-Hui et al., "Efficient Universal Lossless Data Compression Algorithms Based on a Greedy Sequential Grammar Transform—Part One: Without Context Models", IEEE Transactions on Information Theory, vol. 46, No. 3, May 1, 2000, XP011027647.

\* cited by examiner

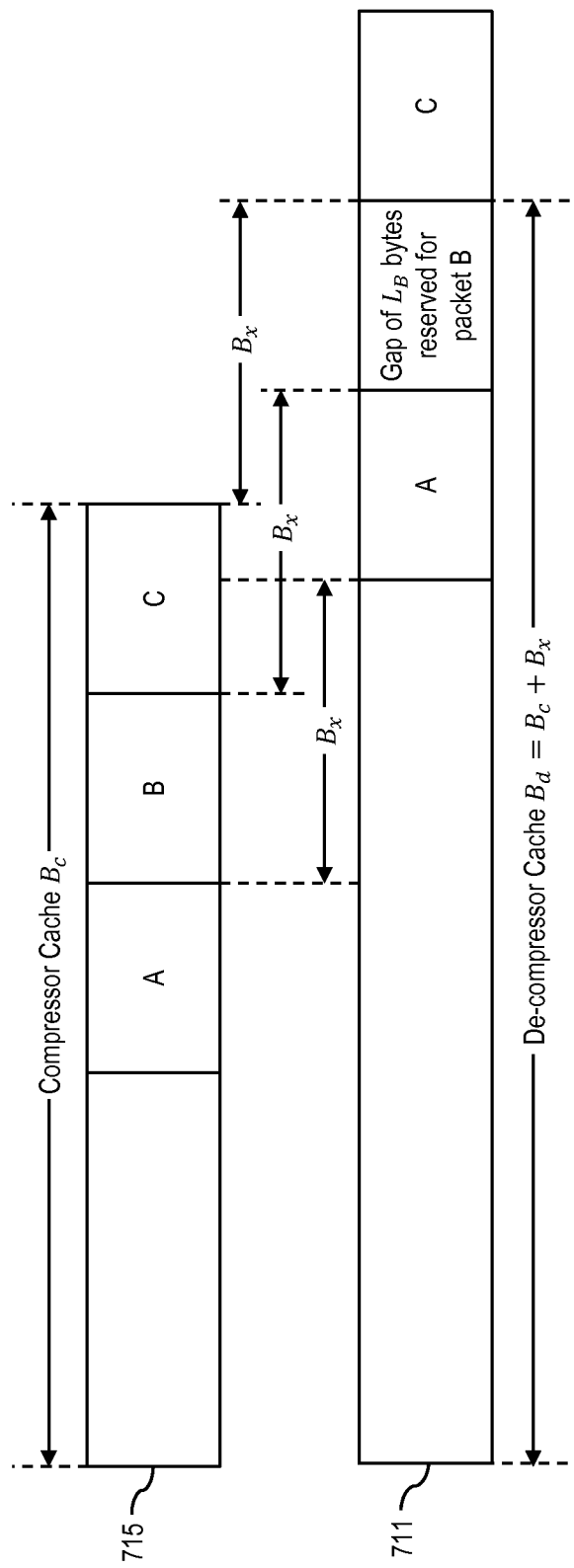

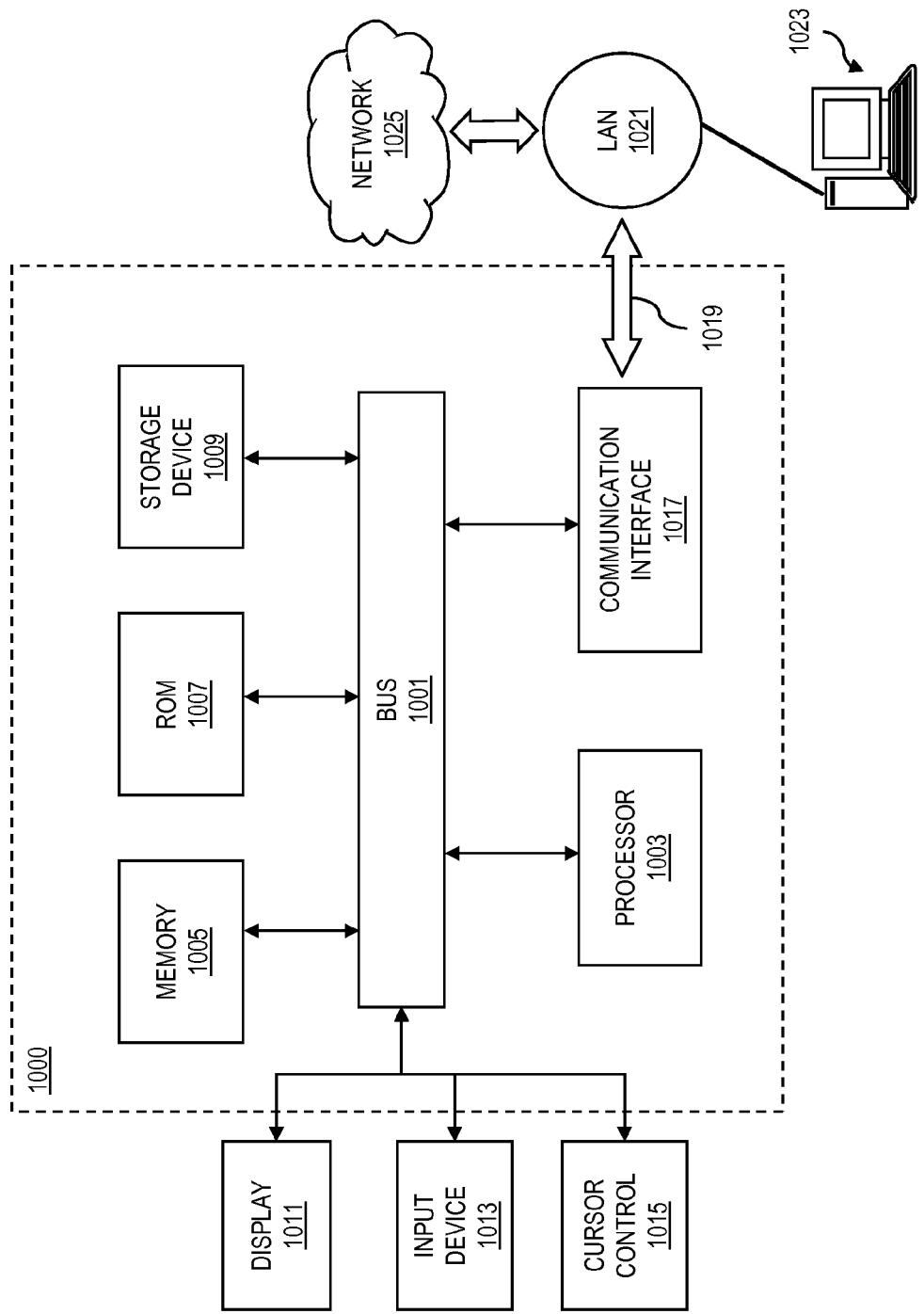

DATA COMPRESSION FOR PRIORITY BASED DATA TRAFFIC, ON AN AGGREGATE TRAFFIC LEVEL, IN A MULTI STREAM COMMUNICATIONS SYSTEM

RELATED APPLICATIONS

This application: (1) claims the benefit of the earlier filing date under 35 U.S.C. §119(e) of U.S. Provisional Application Ser. No. 61/787,257 (filed 15 Mar. 2013), and (2) is a Continuation-In-Part (CIP) of co-pending U.S. patent application Ser. No. 13/180,969 (filed 12 Jul. 2011); each of which is incorporated herein by reference in its entirety.

BACKGROUND

The present invention pertains to the field of data compression techniques, in particular, lossless data compression techniques for efficient transmission of internet traffic over data communications links such as, satellite, terrestrial wireless or wired links.

Analysis of internet traffic reveals that for certain content types, which constitute a significant portion of the total traffic, a high degree of redundancy exists in the transmitted data. This manifests itself in the form of macro redundancies and micro redundancies. Macro redundancies are basically duplications of long byte strings, which occur when the same or similar data entities, (typically comprising hundreds of bytes or more) are repeatedly transmitted on a link between two end points. Micro redundancies occur due to the fine grain syntax underlying the byte sequences, which imposes a structure so that some smaller byte patterns (typically a few bytes in length) occur more frequently than others. Both of these types of redundancies must be fully exploited by lossless data compression techniques to transmit the data most efficiently. The benefit is conservation of communication link resources (such as channel bandwidth and power) as well as improvement in user experience due to lower latency and faster response time.

Redundancies in the data stream can appear at many levels. At the highest level, an entire web page or a document, which was previously transmitted may be retransmitted on the data stream (for example, due to user repeating the request for such an entity); at a lower level, an object within a web page (such as an image belonging to an advertisement in a web page) may be frequently retransmitted, because it is common across multiple popular web pages; or at the lowest level, a byte segment which was previously transmitted may reappear on the data stream. Each of these redundancies can be exploited by preventing the retransmission of the duplicate data, provided appropriate memory and processing techniques are employed at both ends of the connection. Further, the range (e.g., the separation in terms of the number of transmitted bytes from an occurrence of a byte segment to its redundant occurrence), over which redundancies occur in the data stream, can span from a few bytes to several tens or hundreds of megabytes. It is dependent on several factors such as the type of content, speed of the link, usage pattern of the user, the number of users attached to the end point etc. Moreover, the redundancies can be micro redundancies, where the duplications are only a few bytes long or much longer macro redundancies.

Lossless data compression is a powerful technique that compresses data streams for transmission over communications link by reducing data redundancies within the data streams, facilitating improved efficiency and utilization of link capacity. Lossless data compression algorithms exploit statistical redundancy to represent data more concisely, without losing information. A compressor is used to compress packets at one end of the link; at the other end of the link, a decompressor losslessly recovers the original packets. There exists a class of data compression techniques referred to as long-range data compression. Long-range data compression refers to compression techniques that compress data based on a relatively large data dictionary reflecting one or more data streams over a corresponding historical length of time (e.g., the length of time being proportional to the size of the dictionary—the larger the dictionary, the larger the storage capacity to cover longer periods of historical data). Some of the common current techniques for long-range data compression belong to the Lempel-Ziv family of compressors (LZ77 and LZ78, and derivatives thereof, such as gzip, compress, or V.44). Another class of data compression techniques exists, which are referred to as short-range data compression techniques. Rather than relying on a large dictionary (a long historical view of the data stream), short-range data compression techniques operate on small data sets, such as grammar-based algorithms, such as Yang-Kieffer (YK) universal data compression (see, e.g., U.S. Pat. Nos. 6,400,289 and 6,492,917). For example, grammar-based algorithms construct context-free grammar deriving from a single string, and also may apply statistical predictions referred to as arithmetic coding. Such current compression approaches, however, exhibit distinct disadvantages, especially in applications involving the compression of communications traffic (e.g., Internet traffic) that is classified into multiple streams at different priority levels for transport over communications links or channels.

Existing lossless data compression techniques have a stringent requirement that the packets cannot be reordered or lost during transport from the compressor to the decompressor. When traffic is transported as prioritized streams, however, this requirement can only be met on a per-stream basis, but not for the aggregate traffic as a whole. This is because a packet transported on a higher priority stream can overtake a packet transported on a lower priority stream. In other words, for example, in the case of a higher priority packet and a lower priority packet, where the higher priority packet is compressed later in time than the lower priority packet, but is provided transmission priority over the lower priority packet, the higher priority packet (while actually later in time at the compressor) will arrive at the decompressor earlier in time from the lower priority packet. Hence, the packets will arrive at the decompressor out of order, which would result in a failure of the decompression. Consequently, traditional compression techniques can be applied only on a per-stream basis and not on the aggregate traffic, which results in a significant sacrifice in performance. One such performance sacrifice manifests itself as a requirement that the total available memory pool be apriori sub-divided into smaller pools, each respectively associated with a one data stream. Accordingly, because the size of the memory pool represents a significant factor in determining compression performance, the compression would be adversely impacted (e.g., in the efficiency of link utilization). Another performance sacrifice comprises an inability to exploit inter-stream redundancies—e.g., redundancies between different streams cannot be exploited where the compression is applied on a per-stream basis.

What is needed, therefore, is an approach for lossless compression of data traffic (e.g., Internet traffic), in applications involving the compression of traffic that is classified into multiple data streams at different priority levels, where the approach facilitates data compression of the traffic on an aggregate level (as opposed to a per-stream basis), to improve the efficiency for transmission over communications links or channels (e.g., satellite, terrestrial wireless and wired links).

SOME EXAMPLE EMBODIMENTS

These and other needs are addressed by aspects and embodiments of the present invention, whereby approaches are provided for lossless compression of data traffic (e.g., Internet traffic), in applications involving the compression of traffic that is classified into multiple data streams at different priority levels, where the approach facilitates data compression of the traffic on an aggregate level (as opposed to a per-stream basis), to improve the efficiency for transmission over communications links or channels (e.g., satellite, terrestrial wireless and wired links).

In accordance with example embodiments of the present invention, a method for multi-stream data compression comprises receiving, by a long-range decompressor device, a plurality of packets of a transmitted data stream, wherein the plurality of packets comprises versions of respective packets of a plurality of source data streams resulting from a compression process applied to the packets of the source data streams, on an aggregate basis and in a successive order of compression, prior to transmission of the plurality of packets. A decompression process is applied with respect to a one packet of the plurality of packets, and a determination is made as to whether the one packet has been received in a proper order of succession as compared to the successive order of compression. When it is determined that the one packet has been received in the proper order of succession, the one packet is stored at a respective next location in a decompressor data cache, in a form resulting from the decompression process. When it is determined that the one packet has not been received in the proper order of succession, the one packet is stored at a respective location in the decompressor cache, in the form resulting from the decompression process, allowing for subsequent storage of one or more of the plurality of packets in the proper order of succession, in forms resulting from the decompression process, wherein the one or more of the plurality of packets were processed via the compression process before, but were received after, the one packet. According to a further embodiment of the method: the decompressor data cache is larger in size than a corresponding compressor data cache, based on which the compression process was applied, by a cache extension of X bits; the cache extension facilitates application of the decompression process on a packet that has not been received in the proper order of succession; and a range of compressor cache data available at the time of application of the compression process to the out of order packet remains present in the decompressor data cache for decompression of the out of order packet, provided that the out of order packet has not been delayed beyond a maximum degree based on the length of the cache extension.

In accordance with further example embodiments of the present invention, an apparatus for multi-stream data compression comprises a long-range decompressor configured to receive a plurality of packets of a transmitted data stream, wherein the plurality of packets comprises versions of respective packets of a plurality of source data streams resulting from a compression process applied to the packets of the source data streams, on an aggregate basis and in a successive order of compression, prior to transmission of the plurality of packets. The long-range decompressor is further configured to apply a decompression process with respect to a one packet of the plurality of packets, and to determine whether the one packet has been received in a proper order of succession as compared to the successive order of compression. When it is determined that the one packet has been received in the proper order of succession, the long-range decompressor is further configured to store the one packet at a respective next location in a decompressor data cache within a memory of the apparatus, in a form resulting from the decompression process. When it is determined that the one packet has not been received in the proper order of succession, the long-range decompressor is further configured to store the one packet at a respective location in the decompressor data cache, in the form resulting from the decompression process, allowing for subsequent storage of one or more of the plurality of packets in the proper order of succession, in forms resulting from the decompression process, wherein the one or more of the plurality of packets were processed via the compression process before, but were received after, the one packet. According to a further embodiment of the apparatus: the decompressor data cache is larger in size than a corresponding compressor data cache, based on which the compression process was applied, by a cache extension of X bits; the cache extension facilitates application of the decompression process on a packet that has not been received in the proper order of succession; and a range of compressor cache data available at the time of application of the compression process to the out of order packet remains present in the decompressor data cache for decompression of the out of order packet, provided that the out of order packet has not been delayed beyond a maximum degree based on the length of the cache extension.

Still other aspects, features, and advantages of the present invention are readily apparent from the following detailed description, based on the figures and description illustrating and describing a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF SUMMARY OF THE DRAWINGS

Embodiments of the present invention are illustrated by way of example, and not by way of limitation, in the accompanying figures, in which like reference numerals refer to similar elements, and in which:

FIG. 7B illustrates the storage of decompressed packets in the decompressor byte cache with respect to the decompression of packets received at the decompressor out-of-order, in accordance with further aspects of the present invention;

FIG. 10 illustrates a block diagram of a computer system that can be utilized in implementing example embodiments of the present invention.

DETAILED DESCRIPTION

Figure 1:
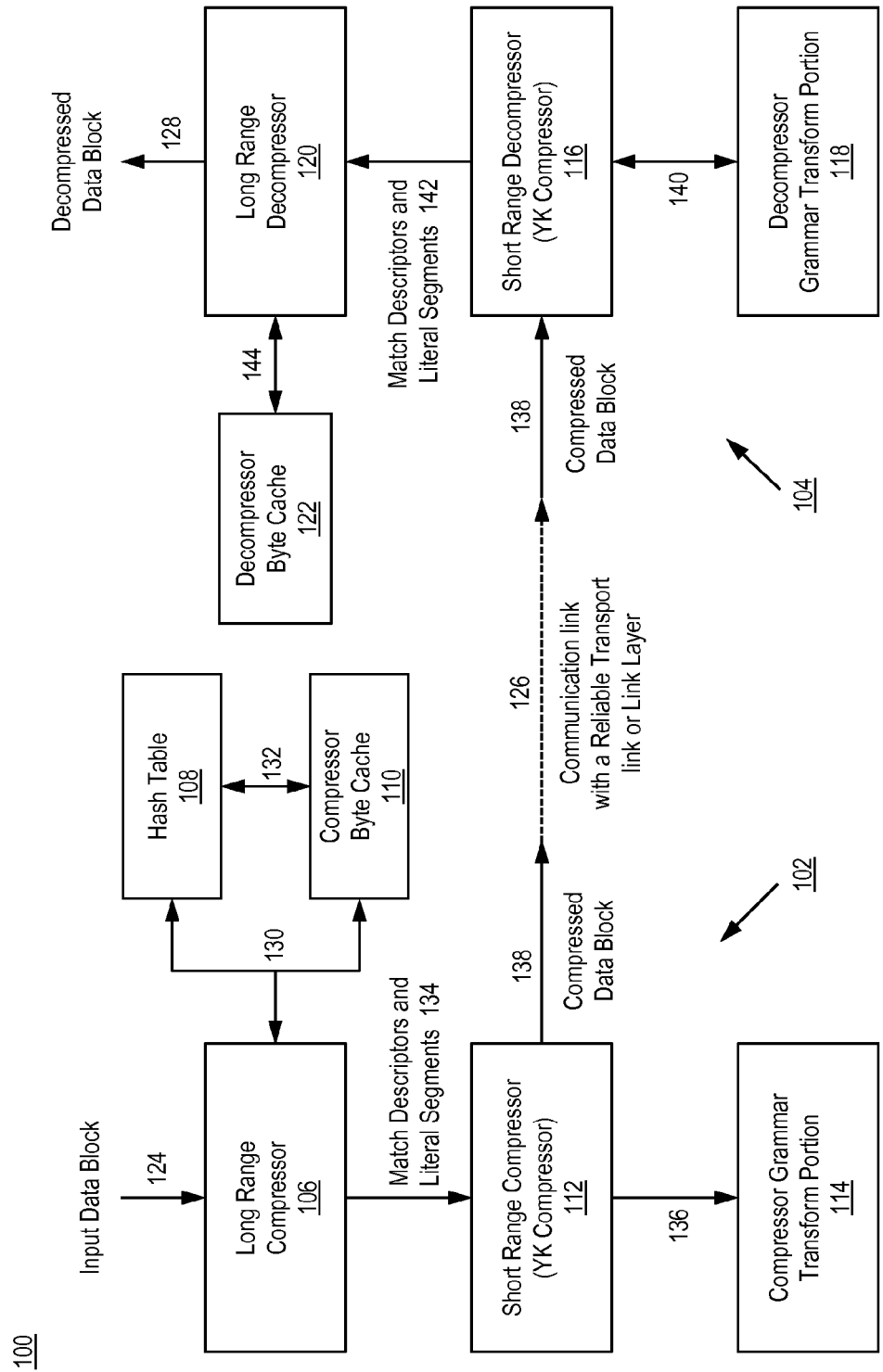
FIG. 1 illustrates a communication system in accordance with an aspect of the present invention.

Systems and methods for lossless compression of data traffic (e.g., Internet traffic), in applications involving the compression of traffic that is classified into multiple data streams at different priority levels, where the approach facilitates data compression of the traffic on an aggregate level (as opposed to a per-stream basis), to improve the efficiency for transmission over communications links or channels (e.g., satellite, terrestrial wireless and wired links), are herein described.

According to aspects and embodiments of the present invention, a novel lossless data compression approach, applicable to efficient transmission of data traffic over data communication links or channels such as satellite, terrestrial wireless or wireline links is provided. Certain types of internet traffic exhibit a significant degree of redundancy and can be compressed accordingly. Lossless data compression techniques reduce or eliminate these redundancies, thereby reducing the amount of traffic carried over the communications channel. This leads to improvement in the utilization of communication channel resources (such as channel bandwidth and power) as well as improvement in end user experience due to reduced latency and faster application response time.

Long range compression (LRC) is a powerful lossless data compression technique for reducing the amount of data transported over a link, so that the link capacity can be utilized more efficiently. Packets entering the link are processed by an LRC compressor, resulting in "compressed" packets of smaller size. At the other end of the link, the compressed packets are processed by an LRC decompressor to losslessly recover the original packets. Compression is generally achieved by detection of duplicate data segments within a byte cache and highly efficient encoding of such duplicate segments. Further, the performance of such compression techniques improve with the size of the byte cache, which is stored in memory. As a result, the size and the optimum use of the available memory resources in the devices that implement compression and decompression is a critical factor in determining compression efficiency.

For example, consider the transport of internet traffic over a communication link. Internet applications and the resulting traffic is highly diverse, comprising a multitude traffic types, such as voice (VoIP), streaming video, file transfer protocol (FTP), web page requests and responses, etc. Each type of traffic has its own characteristics and quality of service (QoS) requirements. Accordingly, in order to address such diverse characteristics and requirements (e.g., quality of service (QoS) requirements), the traffic can be grouped into a number of "traffic classes" based on similarities in characteristics and requirements, where each class is transported based on its respective priorities (hence, the QoS and other requirements are addressed on a class basis). Each traffic class can then be assigned to a separate "stream," where each stream is transported over a "backbone connection," receiving a share of channel resources commensurate with the respective priority and other requirements. Such traffic classification and prioritized transport protocols, however, may result in packets belonging to different streams being reordered during transport over the communications channel. For example, an FTP packet may be compressed before a streaming video packet, but, if the streaming video packet is assigned to a higher priority stream, then the compressed streaming video packet may reach the decompressor (at the receiving end of the channel) before the compressed FTP packet. In such a case, because the packets have been re-ordered, the decompression will fail.

As is thus apparent, the potential for packet re-ordering with such traffic classification and prioritized transport protocols poses significant problems and challenges for current lossless data compression techniques. As explained above, such current techniques require that the packets be presented for decompression (at the receiver end of the communications channel) in the same order as they were compressed (at the transmission end of the communications channel) with no missing packets. Accordingly, the decompression system cannot tolerate packets arriving out-of-order or lost packets. With packets transported in accordance with a stream-based classification and prioritization protocol, however, only packets within a given stream can be expected to arrive in order (as they are all transported at the same priority level). Accordingly, in order to accurately and efficiently apply such current compression techniques to traffic transported as multiple prioritized streams, a separate compressor/decompressor would be required for each stream, which results in less efficiency in the compression performance and increased processing and memory requirements.

Applying compression on per-stream basis poses a number of challenges and disadvantages. For example, the application of compression on a per-stream basis results in increased memory requirements and/or inefficient use of available memory resources. For example, because the performance of a compression protocol improves with the cache/memory size, the cache/memory requirements increase in proportion to the number of streams (the number of compressor/decompressor pairs). For example, as discussed in further detail below, the compression operates based on eliminating segments of present packets that match segments from previous packets stored in the compressor cache (replacing the segments with an identifier of where such matched segments can be retrieved from the corresponding decompressor cache). Accordingly, the probability of having matching segments, and the size of such matching segments increases with the size of the cache and the extent of the data stored in the cache—so, a larger cache, having data on an aggregate traffic level from multiple streams, will provide for a higher probability of match hits and of larger segment sizes of such match hits. Alternatively, the available memory pool for compression would have to be divided into smaller pools (for each stream), whereby the increased probabilities of basing the compression on data across streams would be lost, which results in decreased compression performance. This also would result in underutilization of byte cache for one stream whereas a different stream has a smaller byte cache than necessary and hence is compressed less efficiently. The net result being sub-optimal performance of the compression scheme and reduced link or channel efficiency.

Example embodiments of the present invention present various advantages over traditional approaches. One advantage is that the compression approach in accordance with such embodiments can be applied to the aggregate traffic (the aggregate of all the streams), rather than on a per-stream basis. In that case, the entire available memory pool can be used as a whole for compression, with no sub-division on a class or stream basis. Further, the decompressor can tolerate out-of-order delivery of packets belonging to different streams, with the only requirement being that, within each stream, packets must maintain their order (which, as mentioned above, is generally not an issue, because the packets within a class/stream are transmitted at the same priority level—hence one packet does not have the potential to "overtake" another packet). Additionally, the decompressor can operate in a mode that provides "acknowledgement" messages to the compressor, which enables the compressor to exploit redundancies between different streams, resulting in better compression performance. This is in contrast to traditional compression, which can only achieve compression based on redundancy within a given data stream. In further regard to such acknowledgement messages, the compressor can operate in a mode that enables the decompressor to tolerate packets loss. The compressor, however, is capable of operating without such acknowledgement messages, and thus this presents an optional feature and further advantages.

A long range compressor retains a "long range" of previously received bytes in an input byte stream for compression and captures macro redundancies in the input byte stream. For example, a long range compressor may store copies of the last 10 MB of data that had streamed. As such a current block of 1000 bytes of data may be compared with all of the stored 10 MB for any similar byte sequences (redundancies). The main role of this stage is to provide the compressor access to a large history of past transmitted data (e.g., a large memory buffer of several tens or hundreds of megabytes), while minimizing the processing complexity needed to process the large amount of stored data. The advantage of this stage is that macro redundancies as seen within a long history of the input byte stream can be captured with very modest processing resources.

The first stage having a long range compressor front end may (optionally) be followed by a second stage having a short range compressor back end. For example, a grammar-based compressor, which uses a sophisticated grammar transform and adaptive arithmetic coding, may be used. Alternatively, any short range compressor may be used. The main role of the second stage is to exploit any residual or micro redundancies in the output of the first stage. In example embodiments, the second stage applies a much more powerful compression technique than the first stage. Since the first stage has already eliminated long range redundancies, the second stage can operate with a smaller history (e.g., less data to be processed), with no loss in performance. In particular, a short range compressor retains a "short range" of previously received bytes in an input byte stream for compression and captures micro redundancies in the input byte stream. For example, a long range compressor may store copies of the last 109 bytes of data that had streamed. As such a current byte of data may be compared with all of the stored bytes for any similar bit sequences (redundancies). In other words, the short range compressor uses a smaller amount of received bytes than the long range compressor to determine redundancies. This allows the use of far more powerful techniques than the first stage, and the combination of the two stages delivers near optimal compression gain. The grammar transform and adaptive arithmetic coder used by the second stage are keys to performance. The strategy of capturing the long range macro redundancies by a simpler computation efficient first stage, allows a more sophisticated second stage in order to capture the more complex structural micro redundancies. This reduces the complexity of the overall scheme to a reasonable level, while achieving near optimal compression gains.

In a non-streaming mode compression scheme, compression is based only on the current input block of data and after the current block has been compressed, and the compressor state is reinitialized (i.e., history buffer is cleared). In the non-streaming mode compression scheme, only redundancy within an input block can be compressed. As such, the history of previous blocks cannot be used for compressing future blocks. Consider for example the non-streaming mode compression scheme of conventional file compressors. With conventional file compressors, if two identical files are input into the compressor, one after another, the history of the first file will have already been forgotten when the second file is input. As a result, the overall compressed size is 2× the compressed size of one file. If the conventional file compressor is used in a streaming mode, the overall compressed size will be the compressed size of one file plus a small number of bytes.

In a streaming mode compression scheme, in accordance with aspects of the present invention, compression is based on not only on the redundancy within the current input block in process but also on the redundancy of the blocks that have been processed in the past. The compressor history is dynamic and "live," wherein only the size of the allocated history buffer limits how many blocks the compressor can remember (can make use of). Due to its dynamic memory about the past, a streaming mode compression scheme in accordance with aspects of the present invention provides significantly better compression gain than a non-streaming mode compression scheme. The extent of gain depends on the number of redundancies present in the data and the size of the allocated history buffer. In particular, if most of the redundancies exist among a long range of input blocks, streaming mode compression scheme in accordance with aspects of the present invention will provide a far more efficient compression than that of the non-streaming mode compression scheme.

In an example embodiment, a system is provided for use with streaming blocks of data, wherein each of the streaming blocks of data includes a number of bits of data. The system includes a first compressor and a second compressor. The first compressor receives and stores a first portion of the streaming blocks. For purposes of discussion, presume that the first compressor receives and stores a number n blocks of the streaming blocks of data. Then, the first compressor receives and stores a block of data to be compressed. The compressor is operable to compress consecutive bits within the block of data to be compressed based on the n blocks of the streaming blocks of data. The first compressor can output a match descriptor and a literal segment. A match descriptor is based on the compressed consecutive bits. For example, for purposes of discussion, presume that only a portion of the block of data (string of consecutive bits) to be compressed is the same as a portion (string of consecutive bits) of the first received block—the first block of the previous n blocks of the streaming blocks of data. In this case, a match descriptor may be used to identify or point to the location of the similar portion (the location of the string of consecutive bits) in the first block of the previous n blocks of the streaming blocks of data. By providing merely a match descriptor, as opposed to the portion of the block that is similar to the first block (the actual string of consecutive bits), the overall data size is decreased. The literal segment is based on a remainder of the number of bits of the data to be compressed not including the consecutive bits. For example, as discussed above, presume that only a portion of the block of data (string of consecutive bits) to be compressed is the same as a portion (string of consecutive bits) of the first received block—the first block of the previous n blocks of the streaming blocks of data. The remainder of the block of data to be compressed that is not the same as a portion of any of the first n received blocks are provided as a literal segment. These bits of data are "literally" the same bits of data that are input into the system.

In an example embodiment a fingerprint hash computation portion and a cache are additionally included. In this example embodiment, the first compressor additionally includes a fingerprint computation portion, a fingerprint matching portion and an output block forming portion. The fingerprint computation portion establishes a first window in a first received block of the streaming blocks of data. The block may be in any one of the number n blocks of the streaming blocks of data. For purposes of discussion, presume that the fingerprint computation portion establishes a window of bits of data in the first block of data of the n blocks of the streaming blocks of data. The fingerprint computation portion computes a first fingerprint based on a plurality of bits of data within the first window. A fingerprint of a data window is a string of bits that is much smaller in size than the original data in the window. Because of the much smaller size, much less processing resources are required to compare fingerprints than comparing the original data in the windows. For example, when trying to match one 210-byte data window with 25 other 210-byte data windows, a large amount of processing resources may be needed. However, if fingerprints are used, wherein for example a fingerprint may be a 25-bit entity, much less processing resources may only be required to match one 25-bit data entity with 31 other 25-bit data entities. Once a fingerprint is computed, the fingerprint computation portion can then establish a second window of the block of data to be compressed and to compute a second fingerprint based on a plurality of bits of data within the second window. The computed fingerprints for each block are stored in a hash table and are reused for detecting possible matches in future blocks. The cache stores a first window literal segment of bits corresponding to the first window. The fingerprint hash computation portion then creates a first hash index based on the first fingerprint and creates a second hash index based on the second fingerprint.

A hash function is any well-defined procedure or mathematical function that converts a large, possibly variable-sized amount of data into a small datum, usually a single integer that may serve as an index to an array (cf. associative array). In accordance with aspects of the present invention, the values returned by a hash function are indices to a fingerprint hash table, which stores each fingerprint and its associated metadata (i.e., the location in the cache of the window from which the fingerprint was computed). Hash functions are primarily used in hash tables, to quickly locate a data record given its search key. Specifically, accordance with aspects of the present invention, the search key is a fingerprint, and the hash function is used to map the search key, i.e., fingerprint, to the hash index. The index gives the place where the corresponding record should be stored. The number of possible indices is much smaller than the number of possible fingerprints. Accordingly, hash functions reduce the amount of storage area required to save fingerprints.

The fingerprint matching portion detects if a newly computed fingerprint has a match against any previously computed fingerprint (corresponding to data in the cache). This is based on the hash index of the new fingerprint. The fingerprint stored at that index of the hash table is compared to the new fingerprint. If these two fingerprints are identical, a fingerprint match has occurred. This indicates that an identical window of bits exists somewhere in the cache. The location of this identical window is provided by the metadata. When a newly computed fingerprint is found to match a previous fingerprint for the data in the cache, the match region is expanded to the maximum possible width.

The second compressor is arranged to receive and store the match descriptor and the literal segment from the first compressor. The second compressor operates only on the literal segment and does not modify the match descriptor. The second compressor may use its own history, dictionary, grammar or any other form of internal memory of previously input literals to compress the current literal segment. Any known compression technique may be used. Finally, the second compressor outputs a compressed data block including the match descriptor, as passed directly from the first compressor, and a compressed string of data based on the compressed literal segment.

In an example embodiment, the second compressor includes a parsing portion, a grammar transform portion and an adaptive arithmetic coding portion. The parsing portion successively parses the literal segment into the longest prefixes which matches symbols in a grammar. The grammar is updated after each parsing. Each parsed symbol and information pertaining to the grammar update are passed to the adaptive arithmetic coder. The adaptive arithmetic coding portion performs entropy encoding to represent the parsed symbol and the grammar update to produce compression of the literal segment, wherein entropy encoding is a lossless data compression scheme that is independent of the specific characteristics of the medium. The compressed block output from the second compressor includes the match descriptor and the compressed literal segment.

FIG. 1 illustrates a communication system 100 in accordance with an aspect of the present invention. As illustrated in FIG. 1, communication system 100 includes a compression side 102 and a decompression side 104. Compression side 102 transmits to decompression side 104 via a communication link 126 having a reliable transport or link layer. Compression side 102 includes a long range compressor 106, a hash table 108, a compressor byte cache 110, a short range compressor 112 and a compressor grammar transform portion 114. In this example embodiment, long range compressor 106, hash table 108, compressor byte cache 110, short range compressor 112 and compressor grammar transform portion 114 are illustrated as individual devices. However, in some embodiments of the present invention, at least two of long range compressor 106, hash table 108, compressor byte cache 110, short range compressor 112 and compressor grammar transform portion 114 may be combined as a unitary device.

Decompression side 104 includes a short range decompressor 116, a decompressor grammar transform portion 118, a long range decompressor 120 and a decompressor byte cache 122. In this example embodiment, short range decompressor 116, decompressor grammar transform portion 118, long range decompressor 120 and decompressor byte cache 122 are illustrated as individual devices. However, in some embodiments of the present invention, at least two of short range decompressor 116, decompressor grammar transform portion 118, long range decompressor 120 and decompressor byte cache 122 may be combined as a unitary device.

Long range compressor 106 is arranged to receive a stream of data blocks, and example block of a stream is indicated as an input data block 124. Input data block 124 varies in length, ranging from a few bytes to thousands of bytes, at a time. Some non-limiting examples of input data block 124 are IP blocks or web objects or any other blocks of data, which may be communicated over communication link 126. Long range compressor 106, hash table 108 and compressor byte cache 110 communicate with each other via a signal 130. Hash table 108 receives fingerprints computed by long range compressor 106. A hash function is used to map the fingerprint to its associated hash index. The hash index serves as an index to hash table 108, where the fingerprint and the metadata associated with that fingerprint value is stored. Hash table 108 may be implemented using any known data structure. Compressor byte cache 110 stores the previously received data blocks within the stream of data blocks, which is checked against input data block 124 for redundancy. The fingerprint metadata stored by the hash table 108 corresponds to the location of the fingerprint data window in compressor byte cache 110. Hash table 108 and compressor byte cache 110 communicate with each other via signal 132. Compressor byte cache 110 is implemented as a contiguous circular byte buffer scheme, in accordance with an aspect of the invention, with wrap-around occurring only at block boundaries. The detail implementation of compressor byte cache 110 will be described later.

For the purposes of discussion, presume that input data block 124 contains a segment of bytes, which had occurred in at least one previously received data block of the stream of data blocks. Long range compressor 106, hash table 108 and compressor byte cache 110 work together to look for duplication of a segment of data (not necessarily the whole block), which had occurred earlier. Long range compressor 106 extracts characteristic patterns of data, also called fingerprints, from input data block 124. A hash value is computed for each fingerprint. The computed hash value serves as an index to hash table 108, where the fingerprint and all the metadata associated with that fingerprint is stored. The metadata of a fingerprint is basically a location index to the compressor byte cache 110; it points to the location of the data (within compressor byte cache 110) from which the fingerprint had been computed. Metadata is used to map a fingerprint back to a byte sequence within compressor byte cache 110. Fingerprints are computed for each byte of incoming input data block 124. Based on a fingerprint selection process, most of the fingerprints are discarded and only few are stored. In one embodiment, fingerprints that have 'zero' in their last six least significant bits (LSB) are selected to be stored.

At a later time, if a fingerprint of input data block 124 matches with a fingerprint that is stored in hash table 108, it indicates that bytes of data of a previously received data block match bytes of data of input data block 124. In one embodiment, a fingerprint is computed over window size of data of 64 bytes. There could be a match of more than 64 bytes of data so the match region may be expanded to the left (less recently received bytes) and to the right (more recently received bytes). This will be described in greater detail below. Typically there could be thousands of matching bytes between a current data block and previous data blocks, contributing to long range compression. A valid match indicates that a segment of bytes in input data block 124 match with a segment of bytes stored in compressor byte cache 110. Once a valid match is found, long range compression of that segment of input data block 124 may be performed.

Long range compressor 106 encodes the matched segment as a match descriptor, which contains the information about the location of the matched segment of bytes within input data block 124 and length of the matched segment. The unmatched byte segments, called literal segments, are not compressed. Long range compressor 106 provides match descriptors and literal segments to short range compressor 112 via a signal line 134.

Short range compressor 112 is operable to compress short range duplications in input data block 124, where some byte patterns occur more frequently than others. In a non-limiting example embodiment, a grammar-based compressor is illustrated but any short range compression method may be used for second stage compression. Short range compressor 112 receives blocks that may include multiple match descriptors and literal segments via signal 134. In one embodiment, short range compressor 112 is a more compact and structured form of dictionary based compressors. Dictionary based compressors look for patterns in the byte segments and are based on the assumption that certain phrases occur more often than others. By way of example, short range compressor 112 communicates with compressor grammar transform portion 114 via a signal 136. The literal segment is parsed into a sequence of symbols in grammar transform portion 114. Grammar within grammar transform portion 114 is updated after each parsing.

Overall, the compression processing applied to input data block 124 is determined adaptively. A given segment of input data block 124, depending on (i) the contents of compressor byte cache 110 of long range compressor 106, (ii) the grammar state of short range compressor 112 and (iii) the length of the byte segment, may be processed by long range compressor 106 followed by short range compressor 112 or it may bypass long range compressor 106 and be directly compressed by short range compressor 112. This is motivated by the observation that when compressor grammar transform portion 114 contains the variables that can compactly represent the given segment of input data block 124, short range compressor 112 is far more efficient than long range compressor 106.

Hence, whenever this condition is satisfied, it is beneficial to directly compress the given segment of input data block 124 using short range compressor 112 (i.e., by bypassing long range compressor 106). On the other hand, if compressor grammar transform portion 114 does not contain such variables, the given segment of input data block 124 is processed by long range compressor 106 followed by short range compressor 112. In this case, only the uncompressed "literal" segments in the output of long range compressor 106 are processed by short range compressor 112. This adaptive compression selection mechanism provides a higher overall compression gain than always applying long range compressor 106 followed by short range compressor 112, ignoring the input data or compressor states.

The design parameters of long range compressor 106 and short range compressor 112 are optimized jointly such that the overall compressor provides the best trade-off between the compression gain and the resources needed for the implementation of the compression, i.e., the memory capacity (RAM) and the processing (CPU) power on both the server and the client ends of the network connection. The compression gain is maximized while the complexity (i.e., storage space and processing power) are held at reasonable levels.

Short range compressor 112 provides compressed data blocks 138, which are transmitted over communication link 126 and received by short range decompressor 116. It is essential that communication link 126 provides a reliable transport or link layer to ensure that compressed data blocks 138 are delivered to short range decompressor 116 in the order of transmission and without errors or lost blocks. Short range decompressor 116 decompresses compressed data blocks 138 received over communication link 126 and reproduces data blocks consisting of the match descriptors and literal segments. In this non-limiting example embodiment, a grammar-based decompressor is illustrated for short range decompression but any second order short range decompressor may be used. Short range decompressor 116 communicates with decompressor grammar transform portion 118 via a signal 140. Grammar on the decompressor side needs to be updated based on the information received over communication link 126 such that it is identical to the grammar on compression side 102, in order to achieve lossless decompression. Short range decompressor 116 communicates with long range decompressor 120 via a signal 142.

Long range decompressor 120 receives match descriptors and literal segments from short range decompressor 116 and reconstructs the input data block accordingly. It communicates with decompressor byte cache 122 via a signal 144. Decompressor byte cache 122 needs to be updated based on the information received over communication link 126 such that it is identical to compressor byte cache 110 in order to minimize the data loss. Long range decompressor 120 copies the matched byte segments from decompressor byte cache 122 based on the information provided by signal 142. It places the decompressed blocks in the appropriate locations along with the literal segments to complete the construction of a decompressed block identical to the input block.

Figure 2:
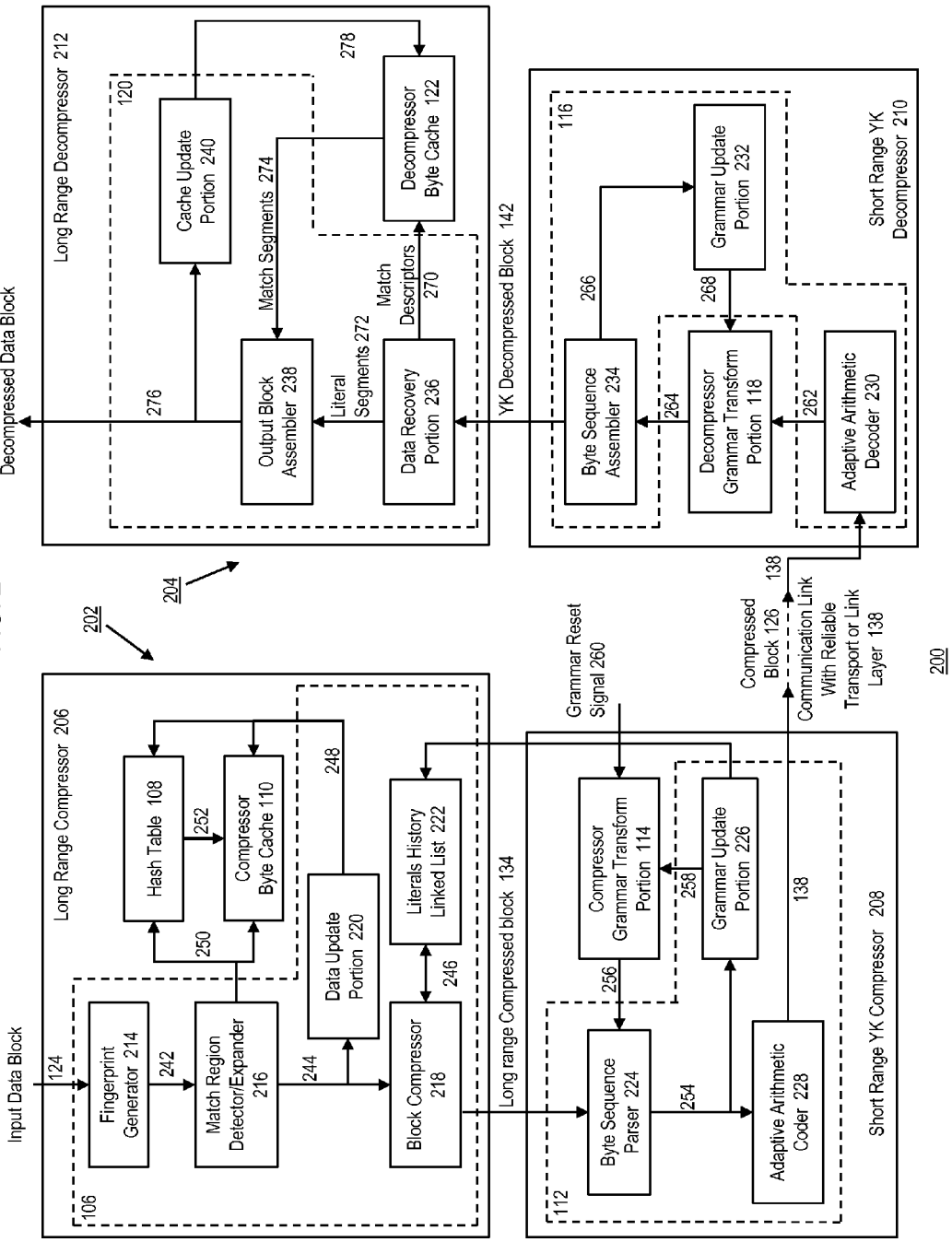
FIG. 2 illustrates an example embodiment of a communication system in accordance with an aspect of the present invention.

FIG. 2 illustrates an example embodiment of a communication system 200 in accordance with an aspect of the present invention. As illustrated in FIG. 2, communication system 200 includes a compression side 202 and a decompression side 204. Compression side 202 includes a long range compression portion 206 and a short range compression portion 208. Long range compression portion 206 includes long range compressor 106 (shown by a dotted region), hash table 108, and compressor byte cache 110 similar to FIG. 1, however the communication between different elements of long range compression portion 206 and its operation is explained in detail with reference to FIG. 2. Short range compression portion 208 further includes short range compressor 112, and compressor grammar transform portion 114 similar to FIG. 1, however the communication between different elements of short range compression portion 208 and its operation is explained in detail with reference to FIG. 2. Further, long range compressor 106 includes a fingerprint generator 214, a match region detector and expander 216, a block compressor 218, a data update portion 220 and a literals history linked list 222. In this illustration, each of fingerprint generator 214, match region detector and expander 216, block compressor 218, data update portion 220, literals history linked list 222, hash table 108 and compressor byte cache 110 are illustrated as distinct devices. However, at least two of fingerprint generator 214, match region detector and expander 216, block compressor 218, data update portion 220, literals history linked list 222, hash table 108 and compressor byte cache 110 may be combined as a unitary device. Short range compressor 112 further includes a byte sequence parser 224, a grammar update portion 226 and an adaptive arithmetic coder 228. In this illustration, each of byte sequence parser 224, grammar update portion 226, adaptive arithmetic coder 228 and compressor grammar transform portion 114 are illustrated as distinct devices. However, at least one of byte sequence parser 224, grammar update portion 226, adaptive arithmetic coder 228 and compressor grammar transform portion 114 may be combined as a unitary device.

Decompression side 204 further includes a short range decompression portion 210 and a long range decompression portion 212. Compression side 202 and decompression side 204 communicate with each other via communication link 126 having a reliable transport or link layer. Short range decompression portion 210 includes short range compressor 116 (as shown by dotted region), and decompressor grammar transform portion 118 similar to FIG. 1, however the communication between different elements of short range decompression portion 210 and its operation is explained in detail with reference to FIG. 2. In this embodiment, a grammar-based decompressor is used, however, any short range decompressor may be used instead. Further, short range decompressor 116 includes an adaptive arithmetic decoder 230, a grammar update portion 232 and a byte sequence assembler 234. In this illustration, each of adaptive arithmetic decoder 230, grammar update portion 232 and byte sequence assembler 234 and decompressor grammar transform portion 118 are illustrated as distinct devices. However, in other embodiments, at least two of adaptive arithmetic decoder 230, grammar update portion 232 and byte sequence assembler 234 and decompressor grammar transform portion 118 may be combined as a unitary device. Long range decompressor 120 includes a data recovery portion 236, an output block assembler 238 and a cache update portion 240. In this illustration, each of data recovery portion 236, output block assembler 238, cache update portion 240 and decompressor byte cache 122 are illustrated as distinct devices.

Focusing now on compression side 202, fingerprint generator 214 is arranged to receive a stream of data that includes sequence of contiguous blocks of data, which needs to be compressed, such as input data block 124. In one embodiment, input data block 124 is a byte stream comprising the internet traffic. The size of the block is variable and depends on the layer at which compression is applied in the network stack. For example, at the IP layer, the blocks may be IP pockets, or at the application layer, blocks may be segments of HTTP objects. As the data enters input data block 124, fingerprint generator 214 computes a fingerprint for each byte of data based on a fast sliding window. In one embodiment, a recursively computed Rabin fingerprint is used to minimize complexity but any known polynomial computation scheme for generating a fingerprint may be used. In one embodiment, fingerprint window is a 64 bytes window. Each fingerprint is a compact characterization of the byte sequence within its fingerprint window. If any two fingerprints match, the byte sequences within the corresponding windows will be identical with a high probability.

Thus, duplicate byte sequences can be detected by comparison of their fingerprint values rather than a byte-wise comparison. A fingerprint is computed for each byte of input data block 124. The computed fingerprint has to be saved when the input block is added to compressor byte cache 110 after the compression of the block is completed. Since cache sizes can be large, it would be impractical to store all the fingerprints computed for each byte of the whole block. As such, a hash system is used to reduce the number of fingerprints saved in accordance with some embodiments of the present invention.

Consider the example the situation where, for a 228 byte cache, there may be 228 possible fingerprints, one for each possible distinct string of bits within compressor byte cache 110. In this example, consider that in input data block 124, only 1 out of every 64 fingerprints are retained. Therefore, as opposed to providing sufficient memory to store the possible 228 fingerprints, only enough memory is required to store 222 fingerprints. This would reduce storage space required for storing fingerprints and fingerprint metadata by a factor of 64. Hence a fingerprint selection process is used to discard most of the fingerprints and select only a small subset for storage. The key requirement for the selection criterion is that it should be position independent, for example, if two fingerprint windows, at two different positions in input data block 124, have identical data, the outcome of the selection criterion should be the same for both fingerprints. In order to meet such requirements, in an example embodiment, fingerprint generator 214 uses a criterion that selects only the fingerprints that have their last $\gamma$ least significant bits as zero, where $\gamma$ is an integer number. If the underlying data is random, this results in the random sampling of the computed fingerprints. The number of selected fingerprints is reduced by a factor of about $2\gamma$ relative to the total numbers of fingerprints computed.

As discussed above, fingerprint generator 214 computes and selects fingerprints for input data block 124. Before further discussing how the selected fingerprints are stored in hash table 108, operations of hash table 108 and compressor byte cache 110 will be now be discussed in detail. Hash table 108 is used to efficiently store the selected fingerprints of the data in compressor byte cache 110 and also to quickly find possible matches against the fingerprints computed for input data block 124. Hash table 108 communicates with compressor byte cache 110 via a signal 252. Each register in hash table 108 contains the fingerprint value and a metadata associated with that fingerprint. The metadata of a fingerprint is basically an index into compressor byte cache 110, and serves to point to the data from which it was computed. Metadata is used to map a fingerprint back to a byte sequence within compressor byte cache 110.

Fingerprints for the data in compressor byte cache 110, computed previously by an identical procedure, are held in hash table 108 as described earlier. The selected fingerprints for input data block 124 are compared against the fingerprints for the data in compressor byte cache 110, i.e., the fingerprints corresponding to the previously received blocks within the stream of data blocks. As discussed above, if there is a match between an input fingerprint and any of the cached fingerprint, it is indicative of a possible match between input byte sequence of input data block 124 in the fingerprint window and a sequence of bytes in compressor byte cache 110. This match has to be further verified to eliminate (i) the possibility that the byte cache fingerprint is stale, i.e., its data is no longer held in compressor byte cache 110 (because it was overwritten by newer data), and, (ii) fingerprint collisions, where two differing byte sequences result in the same fingerprint value. Once these possibilities are eliminated, it indicates a valid match that can form the basis of compression of that segment of input data block 124. Hash table 108 and compressor byte cache 110 receive a data update signal 248 from data update portion 220, which will be described later.

Match region detector and expander 216 communicates with hash table 108 and compressor byte cache 110 via a signal 250. Match region detector and expander 216 compares the fingerprints generated by fingerprint generator 214 for input data block 124 with the previously computed fingerprints stored in hash table 108 associated with the data stored in compressor byte cache 110. If the input fingerprint matches a fingerprint in hash table 108, a match may exist between the fingerprint window of input data block 124 and that of compressor byte cache 110. Note that the length of the match is at a minimum the length of the fingerprint window, but can be longer. In one embodiment, the fingerprint window is 64 bytes long. Longer matches lead to higher compression gain. To detect possible longer matches, the match region is expanded as much as possible both before and after the two matching fingerprint windows. Typically the match region could be expanded to thousands of bytes for long range compression.

The metadata of the matching fingerprint indicates the location of the fingerprint window in compressor byte cache 110. Each input byte to the left of the fingerprint window, starting with the first byte to the left of the fingerprint window, is compared against the corresponding cached byte in compressor byte cache 110. If there is a match, the match region expands by 1 byte to the left. This process continues to expand the match region, byte-by-byte to the left of the fingerprint windows until (i) there is no match, or (ii) the beginning of input data block 124 is reached, or (iii) the beginning of compressor byte cache 110 is reached, whichever occurs first. Similarly, the match region is also expanded to the right of the fingerprint window until (i) there is no match, or (ii) the end of input data block 124 is reached, or (iii) the end of compressor byte cache 110 is reached, whichever occurs first. After this expansion process is complete, a match has been detected between a segment of bytes (at least as long as a fingerprint window width, but possibly much longer) of input data block 124 and a segment of bytes stored in compressor byte cache 110. Once match region detector and expander 216 identifies an expanded match segment in input data block 124, it provides the relevant information to block compressor 218 via a signal 244 for compression and also to data update portion 220. Data update portion 220 communicates to hash table 108 and compressor byte cache 110 via signal 248. Data update portion 220 updates compressor byte cache 110 with the contents of input data block 124 for future matches.

In a non-limiting example embodiment, compressor byte cache 110 is implemented as a contiguous circular byte buffer scheme, with wrap-around occurring only at block boundaries. When a new input data block 124 is added to compressor byte cache 110 it overwrites the oldest data in compressor byte cache 110. If an entire input data block 124 cannot fit at the end of compressor byte cache 110, wrap-around occurs and the entire input data block 124 is added at the start of compressor byte cache 110. This ensures that input data block 124 is not split during wrap-around at the end of compressor byte cache 110. This considerably simplifies cache management, expansion of match regions and verification of stale fingerprints. The simplicity provided for verification of fingerprints also means that the size of the fingerprint metadata that has to be stored is much smaller, reducing storage complexity. Contiguous storage also allows expansion of match regions across (cached) block boundaries, leading to longer matches and improved compression gain.

Figure 3:
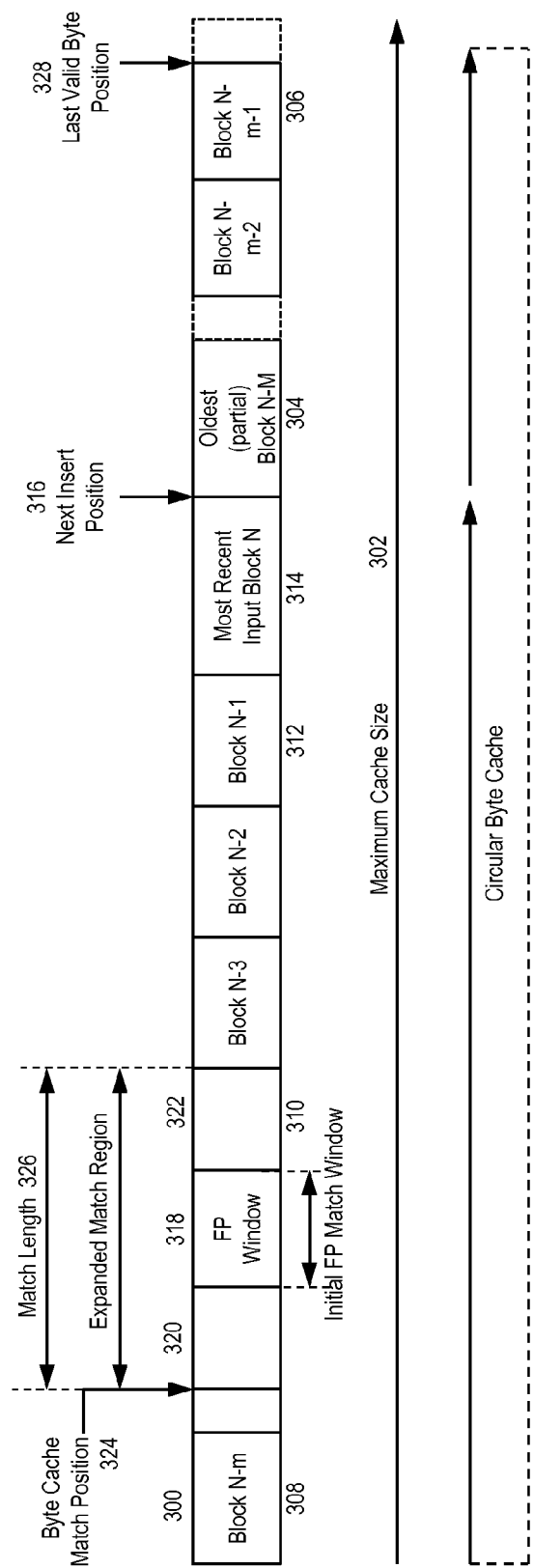
FIG. 3 illustrates an example embodiment of a circular byte cache in accordance with an aspect of the present invention.

FIG. 3 illustrates an example embodiment of a circular byte cache 300 in accordance with an aspect of the present invention. As illustrated in the figure, circular byte cache 300, with a maximum cache size 302, includes a plurality of segments, a sampling labeled as segments 304, 306, 308, 310, 312 and 314.

Segment 304 contains the oldest block in circular byte cache 300, which is about to be overwritten by the next block, indicated by a location 316. Segment 314 is the most recent block, which has been written in circular byte cache 300. Block 310 includes a region 318, a region 320 and a region 322. Region 318 corresponds to a fingerprint window of a cached fingerprint that matches a fingerprint in the current input block and that is detected by match region detector and expander 216. Accordingly, in this example, a consecutive string of data of the most recent input block, block 314, matches the consecutive string of data within region 318. As there is a match, the region is expanded beyond the initial window to the left (more recently received data) and to the right (less recently received data). Region 320 corresponds to an expansion of by match region detector and expander 216 to the right. Region 322 corresponds to a window created by match region detector and expander 216 to the left. Once the total matching is determined, the byte cache match position within circular byte cache 300 is known. Byte cache offset 324 indicates the start of expanded match region that matches with a segment in the most recent input block, block 314, whereas the total match length is represented by double arrows 326.

Circular byte cache 300 is implemented as a contiguous circular byte buffer, with wrap around occurring only at block boundaries, instead of breaking up a block across cache boundaries. When a new input block is added to circular byte cache 300, it overwrites the oldest data in the cache. If an entire input block cannot fit at the end of circular byte cache 300, wrap-around occurs and the entire block is added at the start of circular byte cache 300. For example, if a new block is too big to fit between next insert position 316 and last valid byte position 328 then instead of splitting up the block across cache boundaries, it is added at the start of segment 308. Implementation of circular byte cache 300 as a contiguous circular byte buffer, considerably simplifies cache management, expansion of match regions and verification of stale fingerprints. The simplicity provided for verification of fingerprints also means that the size of the fingerprint metadata that has to be stored is much smaller, reducing storage complexity. Contiguous storage also allows expansion of match regions across (cached) block boundaries, leading to longer matches and improves compression gain.

Compressor byte cache 110 and decompressor byte cache 122 are example embodiments of circular byte cache 300, in accordance with aspects of the invention. Implementation of circular byte cache 300 as a contiguous circular byte buffer, with wrap-around only at block boundaries, has a number of advantages over block based or generic circular buffer based schemes. The contiguous storage of bytes translates to less wasted storage space when compared to block based storage. Contiguous storage also allows expansion of match regions across (cached) block boundaries, which is not possible when caching is done in terms of blocks. Block based caching typically requires the use of an absolute linear block index in order to detect stale fingerprints. This type of indexing has two problems: (i) the index, which is several bytes long, needs to be stored as part of the fingerprint metadata, increasing storage complexity, and (ii) when the linear index ultimately wraps around, this event has to be detected and appropriate measures taken, which introduces complexity. In contrast, the contiguous circular byte buffer proposed here overcomes these problems, uses less storage space, is simpler to implement and also improves compression gain.

Along with updating compressor byte cache 110, data update portion 220 also updates hash table 108 with the selected fingerprints for input data block 124 along with the metadata. Note that the metadata corresponds to input data block 124 that was just inserted into compressor byte cache 110. Given a fingerprint value to be stored in hash table 108, a hash function is used to compute an index to a slot of hash table 108. An attempt is made to insert the fingerprint into the hash slot. Any matched fingerprint, regardless of whether its matching fingerprint was valid, stale or had a fingerprint collision, simply overwrites the existing metadata in the slot. This ensures that the hash table metadata entry for a fingerprint always points to the newest occurrence of a byte segment in compressor byte cache 110. An unmatched fingerprint is inserted successfully only if the slot is unoccupied or contains a stale fingerprint. Even if a large number of fingerprints fail to be inserted, it is not detrimental to performance as explained below.

As new data is inserted into compressor byte cache 110, it overwrites older data. However, hash table 108 may continue to hold the fingerprints that correspond to the overwritten data. Such stale fingerprints are only deleted on an as-needed basis; i.e., if a new fingerprint needs to be inserted into a slot occupied by a stale fingerprint. A stale fingerprint is detected by recomputing the fingerprint value using the data pointed to by the metadata. If the recomputed fingerprint does not match the stored fingerprint, it indicates that the fingerprint has become stale. i.e., the data from which it was computed has since been overwritten by newer input data. Such a stale fingerprint can be overwritten by the fingerprint going to be inserted. This approach of detection of stale fingerprint considerably reduces the amount of storage needed to hold the metadata and also simplifies the implementation of compressor byte cache 110 by avoiding the need for absolute indexing.

The degree to which hash insertion failures occur depends upon the loading factor of hash table 108 (i.e., the number of hash table slots divided by the number of byte cache fingerprints that have to be inserted into hash table 108) as well as the hash function used. It is desirable to keep the loading factor low to minimize the storage complexity of hash table 108. On the other hand, if this loading factor is too small, hash collisions occur, i.e., cases where a fingerprint cannot be inserted because its slot is occupied by a different fingerprint. If a fingerprint is not inserted, a potential duplication of the data within the fingerprint window cannot be detected, resulting in loss of compression gain. Therefore, design of hash table 108 is a tradeoff between storage complexity and performance. It is possible to alleviate this by using multiple hash functions. However, it was found that for the purposes of long range compression, it is possible to tolerate relatively high rates of hash collision and measures such as bucketed hashing and multiple hash functions were not critical. This occurs since the typical match region is much longer than a fingerprint window. Consequently a match region contributes a number of selected fingerprints. Even if some of the selected fingerprints fail to be inserted, as long as the other (even a single) fingerprint is successfully inserted, the entire match region will be detected. The key contributor is the expansion of match regions once a fingerprint match is found.

Returning to FIG. 2, block compressor 218 receives input data block 124 along with the information for the matched segment from match region detector and expander 216. Block compressor 218 is operable to perform long range compression of the matched segment and also to determine which bytes need to be passed along as literal segments to short range compression portion 208. However, under certain conditions, encoding the expanded matched segment of input data block 124 in to a match descriptor may not be the most efficient strategy. It may be more efficient to do short range compression instead of long range compression for certain segments of data blocks. This is explained further with reference to literals history linked list 222.

If short range compressor 112 was used to compress a pervious occurrence of an identical byte segment (or a byte segment containing the current byte segment), short range compressor 112 is more likely to be more efficient than long range compressor 106 for such a segment. This determination also has to take into account the length of such a segment, as longer segments are an exception to this rule. To make this determination, long range compressor 106 maintains a list of descriptors of the literal segment in literals history linked list 222 that were passed on to short range compressor 112. When an expanded match segment is identified in input data block 124, with its length exceeding a minimum length threshold, literals history linked list 222 is checked to see if it is contained in the list. If the segment is in literals history linked list 222, then such a segment is not compressed into a match descriptor; instead it is directly passed in literal form to short range compressor 112 for compression. If the segment is not in literals history linked list 222, then such a segment is compressed by block compressor 218. Block compressor 218 communicates with literals history linked list 222 via a signal 246. Updating of literals history linked list 222 with reference to grammar update is explained further in context of short range compressor 112.

Block compressor 218 is operable to compress the expanded matched segment of input data block 124 by replacing it entirely by a "match descriptor" containing (i) the position of the starting byte of the match in compressor byte cache 110, (ii) the position of the starting byte of the match in input data block 124, and (iii) the length of the match. Since the match descriptor can be only a few bytes long, whereas the match segments can be several tens, hundreds or even larger number of bytes, significant compression gains can be achieved. The match descriptor is all the information needed by long range decompressor 120 to extract the byte segment from decompressor byte cache 122, so that input data block 124 can be exactly reconstructed.

In certain cases, input data block 124 may contain zeros or more such match regions, interspersed with "literal" regions, for which no match was available in compressor byte cache 110. Each match region is replaced by a match descriptor and the literal bytes are preserved exactly and passed on to short range compressor 112 for second stage of compression. Block compressor 218 provides a long range compressed block for each input data block 124 processed to short range compressor 112 via a signal 134. Long range compressed block includes information about block length, match count, match descriptors and literal byte segments.

Figure 4:
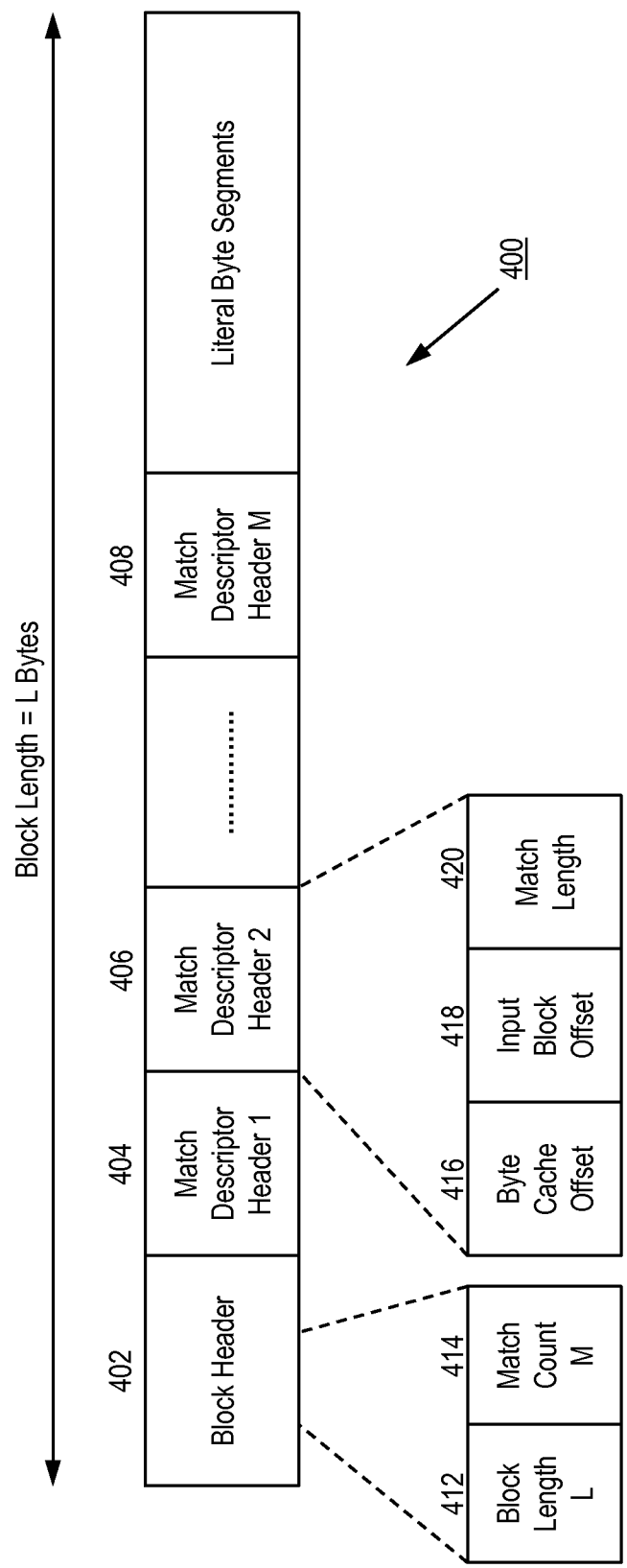
FIG. 4 illustrates an example embodiment of a long range compressed block in accordance with an aspect of the present invention.

FIG. 4 illustrates an example embodiment of a long range compressed block 400 in accordance with an aspect of the present invention. As illustrated in the figure, long range compressed block 400 includes a block header field 402, a plurality of match descriptor header fields (examples shown as a match descriptor header field 404, a match descriptor header field 406, a match descriptor header field 408) and a literal byte segments field 410.

Block header field 402 further includes a block length field 412 and a match count field 414. Block length field 412 indicates total number of bytes in long range compressed block 400. Match count field 414 indicates total number of match segments that were found in input data block 124.

Each match descriptor header field includes a byte cache offset field, an input block offset field and a match length field. For example, match descriptor header field 406 includes a byte cache offset field 416, an input block offset field 418 and a match length field 420. Note that all match descriptor header fields 1, 2, . . . , M have the same format as match descriptor header field 406, even though only match descriptor header field 406 is shown here in expanded form.

Byte cache offset field 416 corresponds to byte cache offset 324 of circular byte cache 300 of FIG. 3. In particular, byte cache offset field 416 indicates the offset location with respect to the beginning of compressor byte cache 110, where the match was found. Input block offset field 418 indicates the offset byte with respect to the beginning of input data block 124, where the match was found. Match length field 420 indicates the length of the matched segment in bytes.

Match count field 414 and match descriptor fields 416, 418 and 420 may be compressed using a variable length code. Each of these entities may be encoded using the 7 least significant bits of one or more bytes, with the most significant bits serving as "continuation bits." If the entity is small enough to be encoded using the 7 least significant bits of all the bytes so far used, the most significant bit is set to zero. Having the most significant bit set as a zero indicates that the byte is the last byte used in encoding the entity. Having the most significant bit set as a 1 means that the next byte was also used in encoding the entity and decoding should continue until a byte with 0 in its most significant is found. Match count, offsets and match lengths tend to be small values most of the time, but can occasionally take on large values. The variable length scheme provides significant savings in representing these values.

Figure 5:
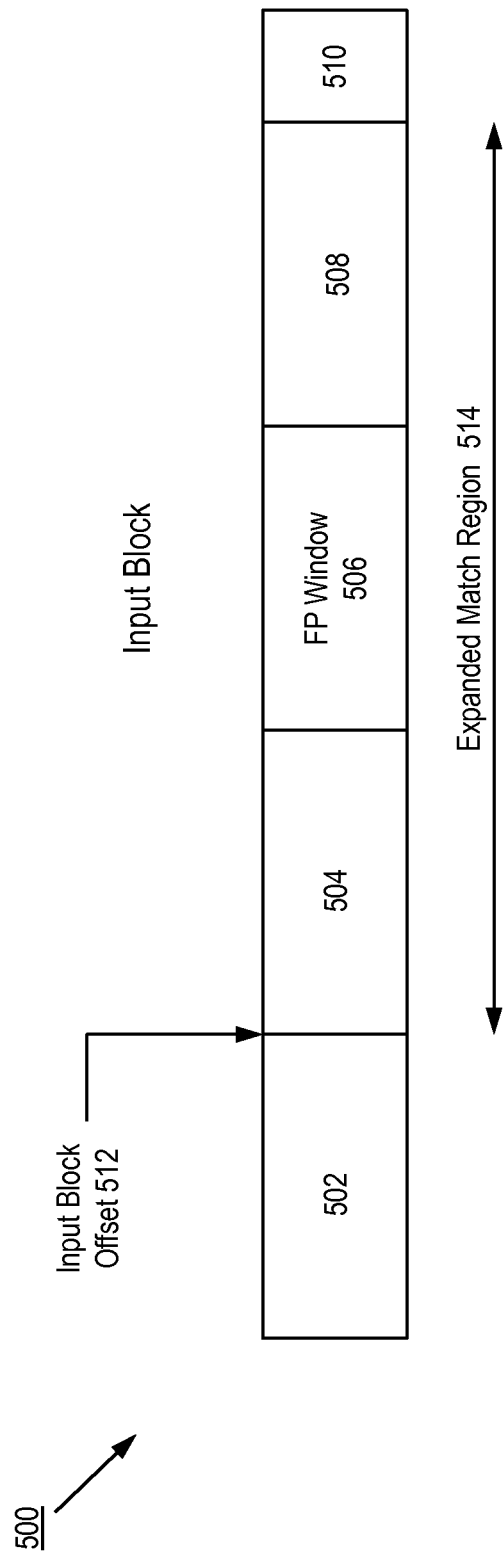
FIG. 5 illustrates an example embodiment of an input block in accordance with an aspect of the present invention.

FIG. 5 illustrates an example embodiment of an input block 500 in accordance with an aspect of the present invention. Input block 500 corresponds to a block of data input into block compressor 218 from match region detector and expander 216. As illustrated in the figure, input block 500 includes a segment 502, a segment 504, a segment 506, a segment 508 and a segment 510. In one embodiment, an input block offset 512 indicates the start of segment 504, segment 506 indicates a fingerprint window and segments 504, 506 and 508 together mark the expanded match region equivalent to match length 420. Input block offset 512 corresponds to input block offset field 418 of long range compressed block 400 of FIG. 4. Segment 506 corresponds to the window created by fingerprint generator portion 214 and additionally corresponds with region 318 of circular byte cache 300 of FIG. 3. Segment 506 was compared with a similar sized window from previous bytes and found to match. The match region, segment 506, was then extended in the left direction until there was no longer matching consecutive bits. This extended match region, segment 504, corresponds to region 320 of circular byte cache 300 of FIG. 3. The match region, segment 506, was additionally extended in the right direction until there was no longer matching consecutive bits. This extended match region, segment 508, corresponds to region 322 of circular byte cache 300 of FIG. 3.

In other words, there is a match in input block 500 starting at byte location 512 with a segment in a byte cache, where the match length corresponds to an expanded match region indicated by the double arrows 514. Block compressor 218 creates a match descriptor header for each matched segment found in input data block 124. If no matched segment were found then there are no match descriptor headers and the match count field 414 is zero. Literal byte segments field 410 contains the unmatched bytes in input data block 124, in exactly the same order of occurrence in input data block 124. If all the bytes in the input data block 124 was matched to one or more segments in compressor byte cache 110, literal byte segments field 410 is empty, i.e., has zero bytes.

Returning to FIG. 2, output of block compressor 218 is received by short range compression portion 208. Byte sequence parser 224 is operable to receive signal 134 from block compressor 218 and a signal 256 from compressor grammar transform portion 114. Short range compressor 112 uses byte sequence parser 224 to find out the longest prefix of new data it has received that is already representable by an existing grammar symbol. Byte sequence parser 224 parses the incoming byte sequence on signal 134 based on the existing grammar symbols in compressor grammar transform portion 114. Once byte sequence parser 224 is done parsing for each grammar symbol, it communicates to grammar update portion 226 via a signal 254 to update the grammar by possibly adding a new symbol, or modifying a existing symbol.

In accordance with another aspect of the present invention, short range compressor 112 may provide a feedback signal to long range compressor 106 to affect operation of long range compressor 106. Grammar update portion 226 also keeps track of when the grammar in compressor grammar transform portion 114 needs to be reset. It provides a signal 260 to compressor grammar transform portion 114 to initialize the grammar. In this embodiment of short range compressor 112, signal 260 is also fed to reset literals history linked list 222. Therefore, literals history linked list 222 is reinitialized whenever the grammar is initialized, and hence contains only the literals since the most recent grammar initialization. This means that the grammar for short range compressor 112 has variables that can compactly represent future occurrences of such literal segments.

When an expanded match segment is identified in input data block 124, with its length not exceeding a maximum length threshold, the literals list is checked to see if it is contained in the list. If this is true, then such a segment is not compressed into a match descriptor; instead it is directly passed in literal form to short range compressor 112 for compression. If this is not true, such a match segment is compressed by long range compressor 106 as described earlier. Note that the selective compression strategy does not require that any indication of this choice be passed to the decompression portion 204.

Adaptive arithmetic coder 228 maps the sequence of symbols received from byte sequence parser 224 into bits. It is based on the presumption that certain grammar symbols occur more often than others. Adaptation allows updating of tables keeping track of frequency of occurrence for incoming symbols while processing the data, which improves the compression ratio of the coders. Adaptive arithmetic coder 228 follows the entropy encoding technique, which suggests that the symbols that are likely to occur more often can be represented using fewer bits. When a sequence is processed by arithmetic encoding, frequently used symbols are represented with fewer bits and not-so-frequently used symbols are represented with more bits, resulting in overall reduction in number of bits used. Adaptive arithmetic coder 228 provides efficiently compressed and encoded output 138 ready for transmission.

Output of short range compressor 112 is transmitted over communication link 126. It is essential that communication link 126 provides a reliable transport or link layer to ensure that compressed blocks 138 are delivered to decompression portion 204 in the order of transmission and without errors or lost blocks. Short range decompression portion 210 performs the inverse operation of short range compression portion 208, in order to reproduce blocks consisting of match descriptors and literal segments from compressed blocks 138. Adaptive arithmetic decoder 230 receives compressed block 138 from communication link 126, which were encoded by adaptive arithmetic coder 228. In order to decode the bits back to symbols such that the decoded symbols exactly match with the encoded symbols on compression side 202, frequency tables in adaptive arithmetic decoder 230 should be updated in the same way and in the same step as in adaptive arithmetic coder 228. Adaptive arithmetic decoder 230 provides decoded symbols 262 to decompressor grammar transform portion 118.

Decompressor grammar transform portion 118 works with grammar update portion 232 to provide decompressed grammar transform of the symbols in to bytes to byte sequence assembler 234. Note that short range decompressor 116 needs to be aware of the grammar transforms and updates on short range compressor 112 side such that the grammars on both compressor and decompressor sides are identical, in order to recover original input data block 124. Byte sequence assembler 234 receives a signal 264 from decompressor grammar transform portion 118 and is operable to assemble the bytes in to proper format of decompressed block 142, which includes match descriptors and literal segments. The format of decompressed block 142, which is identical to compressed block 134, will be explained further on with the help of FIG. 4. Byte sequence assembler 234 updates grammar update portion 232 by adding any new symbols via a signal 266. Short range decompression portion 210 provides decompressed block 142, which includes match descriptors and literal segments, to long range decompression portion 212. Long range decompression portion 212 performs the inverse operation of long range compressed portion 206, in order to reconstruct input data block 124 based on the decompressed match descriptors and literal segments.

Long range decompression portion 212 includes long range decompressor 120 (as shown by dotted line), and decompressor byte cache 122 similar to FIG. 1, however the communication between different elements of long range decompression portion 212 and its operation is explained in detail with reference to FIG. 2. Data recovery portion 236 is operable to receive decompressed match descriptors and literal segments from decompressed block 142. Based on the format of decompressed block 142, as discussed in FIG. 4, it separates out the match descriptors and literal segments. Data recovery portion 236 provides match descriptors 270 to decompressor byte cache 122, which indicates the number of bytes that need to be fetched and the starting address of the byte segment in decompressor byte cache 122. Data recovery portion 236 provides literal segments 272 to output block assembler 238. Decompressor byte cache 122 fetches matched segments based on the starting address and match length provided in match descriptor and provides matched segments 274 to output block assembler 238. Note that long range decompression portion 212 needs to be aware of the updates in compressor byte cache 110 such that the cache contents on both compressor and decompressor sides are identical, in order to recover original input data block 124. Decompressor byte cache 122 also receives a signal 278 from cache update portion 240 in order to add the byte segments which have been decompressed. Accordingly, as is evident, the decompressor cache must always track the compressor cache (e.g., in its cache state, dictionary state, or grammar state, etc.).

Output block assembler 238 reconstructs input data block 124 based on literal segments 272 received from data recovery portion 236 and matched segments 274 received from decompressor byte cache 122. A block header, illustrated in FIG. 4 later on, indicates the number of match descriptors contained in compressed block 138 received from compressor portion 202. Each match descriptor specifies where the matched bytes are in decompressor byte cache 122, the length of the match and the location of the match segment in decompressed block 142. Output block assembler 238 simply has to construct the matched part of the block by simply copying the matched byte segments 274 from decompressor byte cache 122 and placing them in the correct locations of decompressed block. This can possibly leave unfilled gaps in the decompressed block, corresponding to the literal segments. Each unfilled gap can then be filled using the literal segment 272, since these bytes occur in exactly the same order as they appeared in input data block 124. This completes the construction of a decompressed block 276 identical to input data block 124. Similar to data update portion 220 in long range compression portion 206, cache update portion 240 in long range decompression portion 212 adds decompressed block 276 to decompressor byte cache 122 in order to overwrite the oldest bytes. This is performed to make sure that the updated decompressor byte cache 122 is identical to compressor byte cache 110 so that future input data block 124 is decompressed correctly.

The selective compression of input data block 124, depending on the input characteristics, compressor byte cache 110 contents and the state of the grammar, results in improved compression gain over schemes that process each input segment by the same processing steps of long and/or short range compression. The joint optimization of the long range and short range compression is an advantage over techniques that apply only long term compression or only short term compression or apply the two independently such that they are unaware of each other. There is a significant degree of interdependence between the performances of the two stages of compression. Consequently, it is important to optimize the design parameters of the long range compressor 106 taking into consideration the behavior of the short range compressor 112. Extensive parametric studies were conducted to determine the optimal parameters such as minimum match length, fingerprint window length, fingerprint selection rate, size of the byte cache and the size of the grammar. The compression gain of only long term compression portion 206 increases as the minimum match segment size is reduced, because smaller matches can be detected and compressed. However, this reduces the performance of short range compressor 112 to the degree that the overall compression gain deteriorates with reducing minimum match length. The reason for this behavior is that the smaller matches disrupt the continuity of the byte sequence at the input of short range compressor 112 (i.e., many smaller literal segments). This makes it more difficult for compressor grammar transform portion 114 to find the underlying structure. Therefore, it is preferable to use a larger value for the minimum match length, such that the overall compression gain is maximized.

Figure 6:
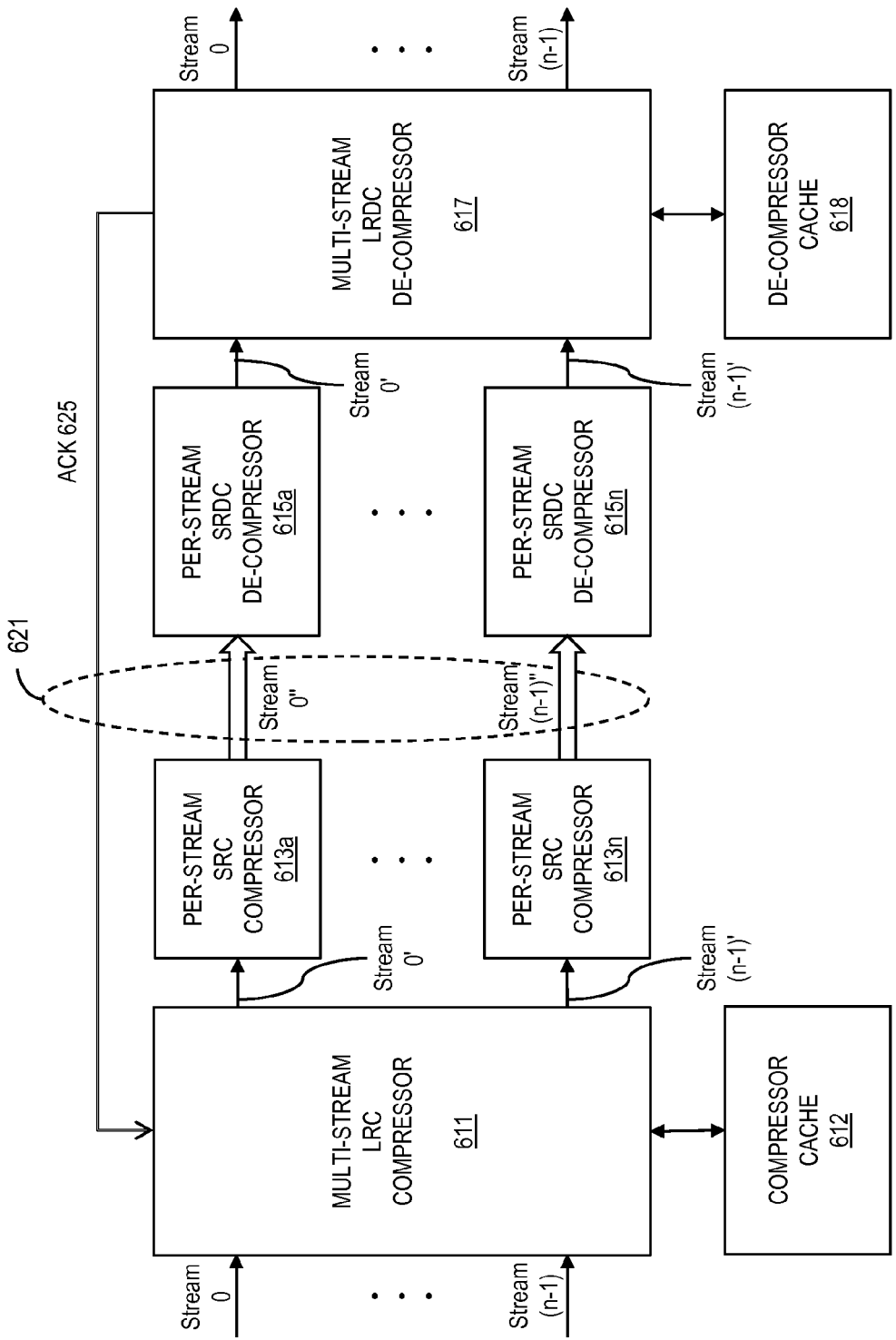
FIG. 6 illustrates a block diagram depicting the architecture of a multi-stream long-range data compression/decompression system, in accordance with example embodiments of the present invention.

FIG. 6 illustrates a block diagram depicting the architecture of a multi-stream long-range data compression/decompression system, in accordance with example embodiments of the present invention. With reference to FIG. 6, the compression system, at the transmitter end of the communications channel, comprises a multi-stream long-range data compression compressor (MS-LRC) 611, which compresses a plurality of data streams—Stream 0 through Stream (n−1), to generate the respective long-range compressed data streams 0' through (n−1)'. The MS-LRC 611 provides compression on the aggregate traffic level, utilizing the single compressor memory/cache 612. For example, depending on system/device resources and the compression system design, the compressor cache 612 may, for example, be of a size ranging from tens of megabytes up to gigabytes or larger. Further, according to different embodiments, the compressor cache may be implemented as a circular buffer, a linear buffer, or other appropriate configurations that serve the purposes as described herein. After the MS-LRC, optional short-range data compression compressors may be inserted on a per-stream basis. For example, the optional per-stream short-range compression (PS-SRC) compressors 613a-613n may be included after the multi-stream MS-LRC, providing additional short-range data compression for the long-range compressed data streams 0' through (n−1)', to generate the respective short-range compressed data streams—Stream 0" through Stream (n−1)". The compressed data streams 0" through (n−1)" (or 0' through (n−1)' in the situation where no short-range data compression is included) are then transported, on a per-stream basis, over the communications channel 621 (e.g., based on their respective priority levels).

At the receiver end the decompression system comprises a multi-stream long-range decompressor (MS-LRDC) 617, which decompresses the plurality of compressed data streams—Stream 0' through Stream (n−1)' to regenerate the original data streams—Stream 0 through Stream (n−1). The MS-LRDC 617 provides decompression on the aggregate traffic level, utilizing the single compressor memory/cache 618. Similar to the transmission side, if the transmission side includes per-stream short-range data compression, then the receiver end will correspondingly include the per-stream short-range data decompression decompressors (PS-SRDC) 615a through 615n. If included, the PS-SRDCs 615a-615n would be inserted before the MS-LRDC 617, providing short-range data decompression for the received data streams 0" through (n−1)", to generate the respective short-range decompressed data streams—Stream 0' through Stream (n−1)'. The short-range decompressed data streams 0' through (n−1)' would then be fed to the MS-LRDC 617 for data decompression on the aggregate traffic level to regenerate the original data streams—Stream 0 through Stream (n−1). In accordance with further example embodiments, the MS-LRDC 617 may be configured to return acknowledgement messages ACK 625 to the MS-LRC 611. When enabled, the MS-LRC 611 utilizes the acknowledgement messages to exploit inter-stream redundancies and also compresses in such a way that the MS-LRDC 617 can tolerate packet loss.

In accordance with example embodiments, for lossless compression, the packet delivery between the MS-LRC and MS-LRDC generally must satisfy certain characteristics or requirements. For example, compressed data packets from different streams may be delivered out-of-order, but not exceeding a maximum delay (in terms of the number of bytes by which the reordered packet was shifted in the byte stream) between the compression at the MS-LRC to the delivery of the packet to the MS-LRDC. In some embodiments, the maximum delay may be a predetermined parameter, whereas, in other embodiments, the maximum delay may be a configurable parameter. For example, if a packet arrives at the MS-LRDC out-of-order by more than the maximum delay, the result may be that it cannot be decompressed. Further, packets of a given data stream/class are delivered to the MS-LRDC compressor in the same order that they were output from the MS-LRC compressor. Additionally, each compressed packet delivered to the MS-LRDC are identical in size and content as the respective compressed packet output from the transmission side LRC compressor (e.g., there should not be any splitting or combining of compressed packets or data corruption).

In accordance with one example embodiment, the MS-LRC compressor maintains the compressor cache 612 (e.g., a byte cache of length $B_c$ bytes). This byte cache acts as a circular (e.g., first-in-first-out) buffer to store the packets input to the compressor, whereby the compressed packets are sequentially added to the byte cache, overwriting the oldest bytes in the cache. Similarly, the MS-LRC decompressor maintains the decompressor cache 618 (e.g., a similar circular byte cache of length $B_d$ bytes). The decompressor cache 618, however, generally is larger than the compressor cache 612 (e.g., $B_d=B_c+B_x$, where $B_x$ reflects a "cache extension"). The cache extension is known to the MS-LRC compressor, and facilitates the decompression of out-of-order packets.

By way of example, the MS-LRC compressor 611 compresses each input packet with reference to the compressor byte cache of $B_c$ bytes. The input packet is represented as a concatenation of a number of "match regions" and "literal regions." Each match region reflects a contiguous byte segment of the input packet that matches a contiguous byte segment in the compressor byte cache. The match regions typically have a minimum length requirement (e.g., 64 bytes). One or more literal regions may occur between match regions (or there may not be any literal regions), where literal regions occur, each literal region reflects a segment of the input packet for which a match was not found in the byte cache. The compression is achieved by replacing each match segment by a "match descriptor," which is much smaller in length (hence reducing the length of the overall input packet) and specifies the location and the length of the matching byte segment in the decompressor cache. Regarding the literal regions, these regions are not compressed by the MS-LRC. Each resulting compressed MS-LRC packet thereby consists of a number of match descriptors and literal segments. After each input packet is compressed, the input packet (in its un-compressed format) is added to the compressor byte cache, overwriting the oldest data byte.

In accordance with an alternative embodiment, each long-range compressed packet may be further compressed by an optional second stage compression (e.g., the subsequent short-range data compression performed by the PS-SRC compressors 113, when included in the system). For example, the second stage compression may comprise a GBC or V.44 compression algorithm. The main role of the second stage is to exploit any residual or micro redundancies in the output of the first stage. For example, the second stage may apply a more powerful algorithm than the first stage. In view of the fact that the first stage has already eliminated long range redundancies, the second stage can operate with a smaller history (hence there is less data to be processed), with no loss in performance. In particular, a short-range compressor retains a short or recent range of previously received bytes in an input byte stream for compression, and thus captures "micro redundancies" in the input byte stream. For example, while a long range compressor may store the last $10^9$ input bytes of data, and thus a current input data byte may be compared with all of the stored $10^9$ bytes for any similar bit sequences or redundancies (match regions), the short-range compressor uses a smaller amount of received bytes than the long range compressor to determine redundancies. This in turn permits the use of more powerful techniques than the first stage, and the combination of the two stages delivers near optimal compression gain.

By way of further example, at the decompressor, the MS-LRDC decompresses the packet with reference to the decompressor byte cache of $B_d$ bytes. Similar to the MS-LRC compressor, after each packet is decompressed, the MS-LRDC decompressor stores the decompressed packet (which matches the corresponding packet input to and compressed by the compressor) in the decompressor byte cache, overwriting the oldest data byte. Accordingly, since the compressor stores each input packet in the compressor byte cache, and the decompressor stores each respective decompressed packet in the decompressor cache, the decompressor cache will contain the same data bytes as stored in the compressor cache (except for out-of-order or missing packets, which are discussed in further detail below). However, while the decompressor cache contains the same byte sequences as the compressor cache, because the size of the decompressor cache is larger than that of the compressor cache, the corresponding byte sequences may be at different locations in the decompressor cache as compared to the compressor cache. To account for this, the decompressor cache size is known to the compressor, enabling the compressor to determine the location of a corresponding matching byte segment in the decompressor cache. Then, based on that determination, the compressor generates the match descriptors (to be inserted in the compressed packets) such that they indicate the location of the matching byte sequences in the decompressor cache. The MS-LRC decompressor is then able to decompress a packet (or reconstruct the input packet) by accessing each match segment from its byte cache based on the respective match descriptor and inserting the segment in the packet at the location of the match descriptor. The literal segments have not been altered, so the decompressor simply leaves those segments as is. The decompressed packet is then added to the decompressor byte cache.

Figure 7A:
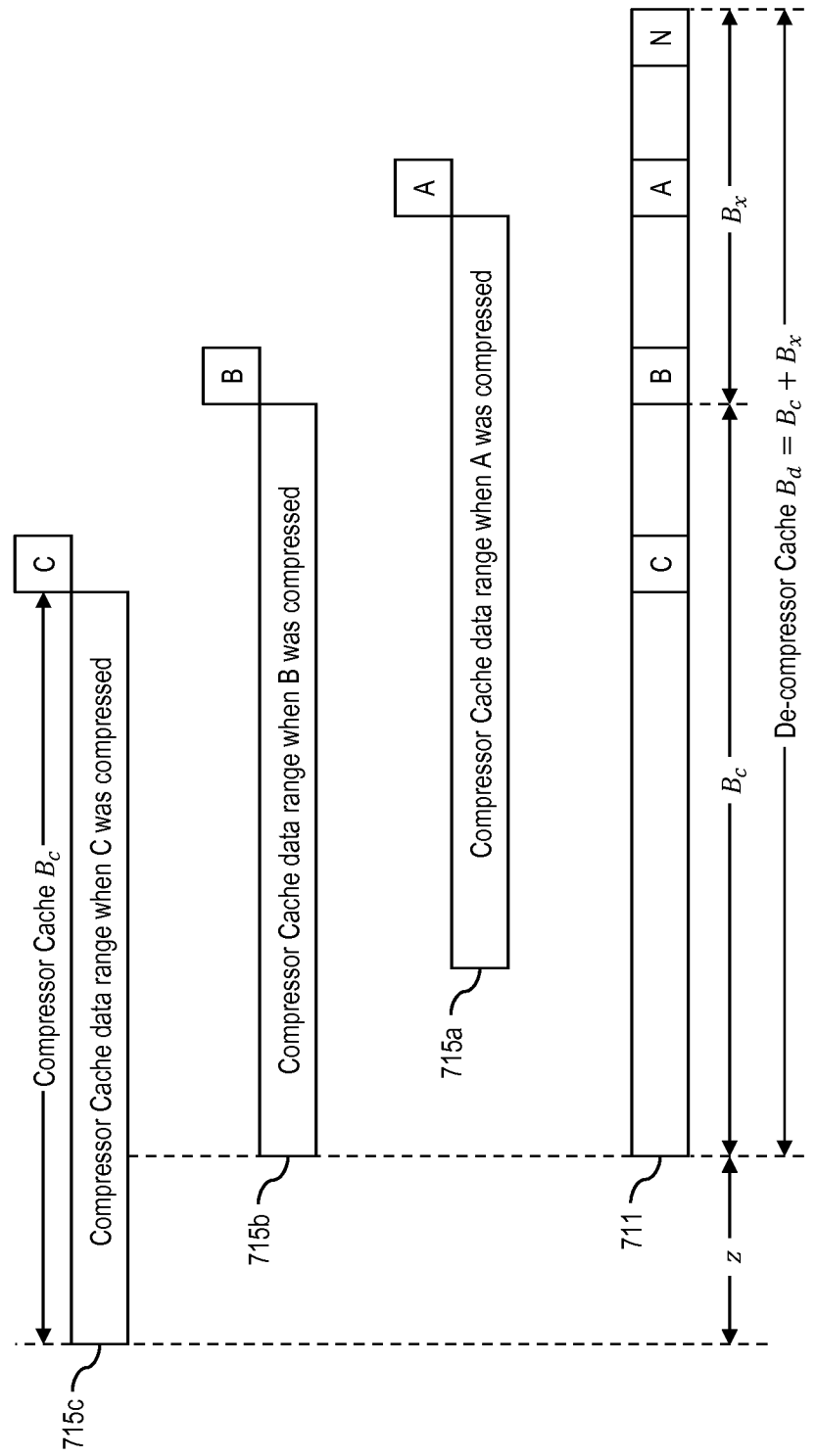
FIG. 7A illustrates cache states with respect to decompression of packets from one stream arriving at the decompressor out-of-order with respect to the respective compression order at the compressor, in accordance with further aspects of the present invention.

FIG. 7A illustrates cache states with respect to decompression of packets from one stream arriving at the decompressor out-of-order with respect to the respective compression order at the compressor, in accordance with further aspects of the invention. As specified above, the decompression of out-of-order packets is facilitated by configuring the decompressor cache to be of a length ($B_d$) that exceeds the length of the compressor cache ($B_c$) by a cache extension ($B_x$), and the degree to which packets can be decompressed out-of-order depends on the length of the cache extension $B_x$. This is reflected in FIG. 7A by the decompressor cache 711, which is of a length $B_d=B_c+B_x$. The state of the decompressor cache, as depicted in FIG. 7A is after the most recently received packet N has been decompressed and added to the cache. Further, as is also evident, the decompressor cache cannot be assumed to contain data received by the decompressor more than $B_d=B_c+B_x$ bytes prior to the last byte N. In this context, for example, consider three packets A, B and C that are received for decompression out-of-order after the packet N. First, in the case of packet A, the range of compressor cache data that was available to the compressor at the time packet A was compressed 715a remains present in the decompressor cache, and thus the decompression of packet A can be performed successfully. In the case of C, however, some of the data (z) available to the compressor at the time C was compressed 715c is no longer present in the decompressor cache, and thus the decompression of packet C may fail. The decompression of packet C, however, will not necessarily fail, because the data present in the compressor cache at the time of the compression of C (which is no longer available in the decompressor cache) may not have been used for the compression of packet C. For the decompression to fail, the data no longer available in the decompressor cache must have been used for the compression of the respective packet (in this case, packet C). Packet B presents a marginal case. As illustrated in the figure with respect to packet B, which was transmitted $B_x$ bytes before N, the decompressor cache contains exactly the $B_c$ bytes that were available to the compressor at the time B was compressed 715b, and thus the decompression of packet B may fail (depending, at least in part, on any delay experienced in the receipt of packet B). Accordingly, as long as a packet is not delayed (relative to the most recently received packet) by more than $B_x$ bytes (the decompressor cache extension), the decompression of that packet can be performed successfully. Otherwise, the decompression of the packet may (but not necessarily) fail.

FIG. 7B illustrates the storage of decompressed packets in the decompressor byte cache with respect to the decompression of packets received at the decompressor out-of-order, in accordance with further aspects of the invention. For example, in order to facilitate successful decompression of compressed data packets received out-of-order at the decompressor, each decompressed packet is stored at a location in the decompressor byte cache where it would have been stored had all packets been received in the order in which they were compressed at the compressor. With reference to FIG. 7B, the three packets A, B and C are compressed and transmitted in that order (A, then B, then C), and stored in the compressor cache 715 accordingly. Packets A, B and C, however, are not received at the decompressor in the same order as compressed—packets A and C are received prior to packet B. The decompressor first receives and decompresses packet A, and accordingly stores packet A in the decompressor cache at the location of packet A, as depicted in the decompressor cache 711. The decompressor then receives and decompresses packet C, but does not store packet C in the next available location in the decompressor cache. Instead, the decompressor recognizes that it has not yet received packet B, and thus it stores the decompressed packet C in the decompressor cache at the location of packet C, as depicted in the decompressor cache 711—the decompressor leaves a gap of $L_B$ bytes in the decompressor cache (equaling the length of packet B) at the location where the packet B would have been stored had it been received in the order with respect to packets A and C in which they were compressed. When the packet B is eventually received and decompressed, it will be stored in the location reserved for it considering the correct relative order. In that manner, the decompressor stores the packets in the same relative locations as they are stored in the compressor byte cache, which in turn maintains the integrity of the compressors knowledge as to the location of the respective match segments in the decompressor cache. This facilitates the continued accurate specification of the match segments in the decompressor cache via the match descriptors.

With respect to the foregoing aspects of the invention, whereby the decompressor stores the decompressed packets within the decompressor cache in the same relative order in which the packets were compressed, it should be noted that the decompressor possesses no knowledge of the lengths of out-of-order packets that are yet to be received (e.g., in the above example, the decompressor has no knowledge of the length $L_B$ of the packet B at the time the packet C is received). The decompressor is thus incapable of independently determining the correct storage location of a packet received out-of-order, such as packet C (e.g., the decompressor cannot independently determine the proper length to reserve as a gap for the storage of the packet B). According to an example embodiment, therefore, the information necessary to compute the decompressor cache location for each packet is determined by the compressor and transmitted along with the compressed packet in the form of a "location index." The compressor, for example, computes the location index based on the length and order of the transmitted packets and the decompressor cache size. The decompressor then uses the location index to derive the in-order storage locations the respective decompressed packets, irrespective of the order in which the packets are received and decompressed.

By way of example, in one embodiment, the location index directly specifies the decompressor cache location for a packet. With such a method, however, the range of the location index relative to the size of the decompressor cache $B_d$ would be limited (e.g., with the decompressor cache being $B_d$ bytes, the location index would be less than or equal to $B_d-1$). Further, as discussed below, according to further embodiments, the location index may also be used as a packet identifier in acknowledgement messages, and thus the same location index may be used for acknowledgement of different packets over an interval of time. In order to allow for a delay in acknowledgement of a packet decompression and minimize ambiguity, it would thus be desirable to maximize the range of the location index. To this end, according to an alternative embodiment, the location index may be computed as if the decompressor cache size is $M*B_d$, where M is an integer, whereby the actual decompressor cache location would equal the computed location index modulo $B_d$. The range of location index is thereby expanded to $M*B_d$, and is limited only by the number of bytes used to transmit it. For example, if the location index is 4 bytes, then the integer M would be chosen so that $M*B_d$ is the largest integer less than $2^{32}$.

As previously specified, in accordance with further aspects of the invention, the decompressor may be configured to provide return acknowledgement messages to the compressor, identifying the packets that have been received. As one embodiment, the location index would be used as an identifier within an acknowledgement message to identify the respective packet being acknowledged. An acknowledgement message or "ACK Block" specifying one or more received packets would be sent back to the compressor at intervals determined by the decompressor. While such an acknowledgement feature is not essential to for the provision of a compression/decompression system in accordance with aspects of the present invention—capable of compressing/decompressing packets (on an aggregate traffic level) in a multi-stream and priority class scenario (e.g., enabling the decompression of packets received out-of-order), under certain conditions, acknowledgement messaging enhances the compression performance.

By way of example, normally, in the presence of packet reordering or packet loss over the communications link, the MS-LRC compressor has no knowledge of the particular transmitted packets that have actually been received by the decompressor. More specifically, when compressing a packet, the compressor can only use the regions of its cache that the compressor knows (with some degree of confidence) will match the data in corresponding regions of the decompressor cache (which is based on an assumption that the respective packets have been received by the decompressor and are thus stored in the corresponding regions of the decompressor cache). In the absence of acknowledgement messages from the decompressor (in the case of a lossless link), such a degree of confidence would thus be restricted to cached packets of the same stream (because packets of the same stream maintain order, and are thus stored in the corresponding or correct locations of the decompressor cache). Otherwise, if the packets are not received in order, then the compressor will not have accurate information to generate the correct match descriptor for the decompressor to locate the respective match segments in the decompressor cache. In other words, for a lossless link, when compressing a packet of a particular stream, the compressor can only use data in the compressor byte cache that corresponds to cached packets of the same stream. Alternatively, for a lossy link, the compressor cannot assume that any packet has been received by the decompressor unless it has been acknowledged by the decompressor. In embodiments where the decompressor provides acknowledgement messages to the compressor, the compressor thereby receives additional information regarding the specific packets that have been received and are thus stored in the decompressor cache. Further, based on the location indexes provided by the compressor, the decompressor stores these specific acknowledged packets in the correct relative location. Accordingly, the employment of acknowledgement messages enables the compressor to use regions of its cache containing the acknowledged packet data for compressing subsequent input packets, irrespective of the specific data streams. Hence, the use of acknowledgement messages facilitates improved compression performance (e.g., where there is commonality in data characteristics between different data streams). For example, with respect to the reliability of a link or channel, in the case of a layered communications protocol, the compression/decompression will operate at one layer. Link reliability, to create a lossless link, may be ensured via a lower link or transport layer (e.g., a TCP/IP link layer or a performance enhancing proxy (PEP) backbone layer). For instance, the link layer may provide for retransmission of lost packets, such that, at the compression/decompression layer (and abstraction above the link layer), a reliable (lossless) link can be provided (transparently to the compression/decompression system).

In view of the foregoing, the multi-stream LRC in accordance with embodiments of the invention operates in different modes depending on such factors as whether the communications link or channel is lossy or lossless, and whether acknowledgment messaging is employed in the system. By way of example, such modes are specified in the following Table 1:

TABLE 1

|  | Lossless Link | Lossy Link |
| --- | --- | --- |
| Acknowledgement Messaging NOT employed | Packet belonging to stream M is compressed based only on cached packets of stream M. | Multi-stream Compression is not reliably feasible. |
| Acknowledgement Messaging IS employed | Packet belonging to stream M is compressed based on any cached packets of stream M, and cached packets of other streams that have been acknowledged. | Packet belonging to stream M is compressed based only on packets of stream M that have been acknowledged. |

With regard to the foregoing table of operational modes, in the case of where the link is known to be lossless, as discussed above, if the decompressor does not provide acknowledgement feedback, the compressor is restricted to using regions of its cache that contain packets of the same stream (which the compressor knows, with a high degree of confidence, have been received by the decompressor and are stored in the correct relative locations of the decompressor cache—because they presumably have not been received out-of-order). Alternatively, with a lossless link, if the decompressor provides acknowledgements, then compression can still be based on cached same-stream packets, and additionally can be based on acknowledged packets of other streams (because the compressor knows that the acknowledged packets have been received and are stored in the correct relative locations of the decompressor cache based on the respective location indexes provided by the compressor). On the other hand, in the case of a lossy link, in the absence of acknowledgment messaging, the compressor cannot assume that the decompressor has received any transmitted packets. In the case of a lossy link, therefore, for reliable decompression, it is essential for the system to employ acknowledgement messaging (e.g., enabling the feature in a system where acknowledgment messaging can be enabled and disabled). Then, with acknowledgement messaging over a lossy link, the compressor compresses packets based only on data stored in the compressor cache corresponding to packets that have been acknowledged by the decompressor (e.g., either acknowledged packets of the same stream or other streams). In other words, despite packet loss over the link, compression and decompression can continue in this manner, because, in compressing an input packet, the compressor uses only cached packets that have been acknowledged—if a packet is lost, the compressor will not receive a corresponding acknowledgment, which prevents the compressor from using that packet for compression (because it is not cached in the decompressor cache).

Figure 8A:
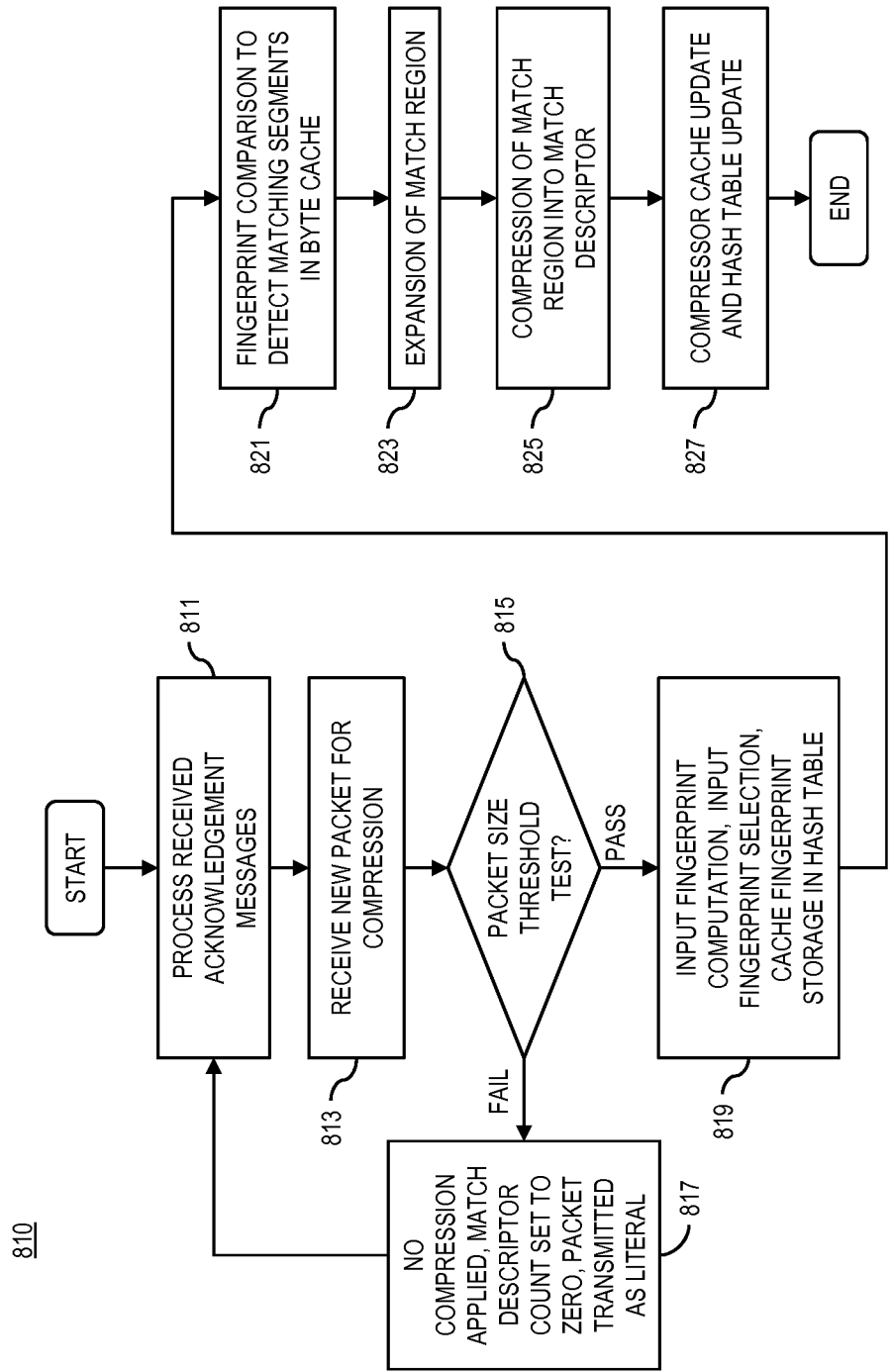
FIG. 8A illustrates a flow chart of a compression process for a multi-stream long-range data compression/decompression system, in accordance with example embodiments of the invention.

FIG. 8A illustrates a flow chart of a compression process 810 for a multi-stream long-range data compression/decompression system, in accordance with example embodiments of the invention. With reference to FIG. 8A, at Step 811, the MS-LRC compressor first processes any received acknowledgement messages by marking each acknowledged packet within the compressor cache as usable for compression. By way of example, the compressor maintains a linked list of metadata for the packets that are in its cache, and include within the metadata fields for the transmitted location index as well as an ACK'ed flag (which is initially set to 0). The acknowledged packet is identified based on a comparison of the location index in the ACK message against the packet indices in the metadata list, and, if a match is found, the ACK'ed flag field would be set to 1. At Step 813, a new packet is received by the MS-LRC for compression. At Step 815, a packet size threshold test is applied to determine if the packet size is above a predetermined threshold—this test is performed to ensure that the compression overhead is not incurred for a small packet that does not justify the overhead. If the packet size threshold test fails, then no compression is applied, and a field specifying the number of match descriptors (match descriptor count) is set to 0, indicating that the entire packet is literal). If the packet size threshold test passes, then the compression process proceeds.

In accordance with one embodiment, at Step 819, an input fingerprint computation is performed, whereby a fingerprint is computed using the bytes within a finger print window positioned at each successive byte position of the input packet. By way of example, the computation is based on a fast sliding window hash and a recursively computed Rabin fingerprint to minimize complexity. A fingerprint is typically 8 bytes long. A match between two fingerprints indicates (with a high probability) that the byte sequences within the corresponding windows will be identical. Duplicate byte sequences can thereby be detected by comparison of their fingerprint values rather than a byte-wise comparison. Further, since a fingerprint is computed at each byte position, it becomes impractical to process/store all computed fingerprints for an input packet, and thus a fingerprint selection process is used to select only a small subset and discard the rest. By way of example, a key requirement for the selection criterion may be that the selection process should be position independent—if two fingerprint windows (at different positions within a packet) have identical data, then the outcome of the selection criterion should be the same for both fingerprints. Such a requirement can be met by a criterion that selects only the fingerprints that have their last $\gamma$ least significant bits as 0, reducing the number of selected fingerprints by a factor of about $2^\gamma$ relative to the total number of fingerprints computed. Additionally, the fingerprints of previously transmitted packets (which are currently in the compression byte cache) are stored in a hash table to achieve efficient storage and retrieval. By way of example, each slot in the hash table contains (i) the fingerprint value, (ii) the cache location of the data from which it was computed, and (iii) a stream index of the data from which it was computed. To resolve hash collisions and improve hash table occupancy, two hash functions may be used and each hash table index can contain two buckets.

At Step 821, a fingerprint comparison is performed to detect matching segments in the compressor byte cache. Each selected fingerprint for the input packet is hashed to compute its hash table indices and compared against the entries at those hash table locations, and, if a match exists, then the selected fingerprint is stored base on one of these indices in the hash table. A match between an input fingerprint and any of the cached fingerprints indicates a possible match between the respective input byte sequence in the fingerprint window and a sequence of bytes in the cache. The table is initially searched for same-stream matches, and, if the same-stream search fails, then other-stream matches are considered. Then, if multiple matches exist, preference is given to same-stream matches. As previously discussed, the consideration of same-stream and other stream matches, however is subject to the operational mode (based on presence of acknowledgment messaging and losslessness of the link, in accordance with Table 1, above. If the link is lossless, the match has to be against cached data from the same stream (either ACK'ed or un-ACK'ed), or ACK'ed data from other streams in order to be considered valid—otherwise, the match is rejected—if the decompressor is not providing acknowledgement messages, then this implicitly eliminates matches against other stream data. If the link is lossy, the match has to be against cached and ACK'ed data (regardless of stream) in order to be considered valid—otherwise, the match is rejected—the decompressor must be providing acknowledgement messages in this case; otherwise no matches will be detected. Further, if a valid fingerprint match is detected, it is further verified to eliminate the possibility of a fingerprint collision (e.g., where two differing byte sequences result in the same fingerprint value). Once fingerprint collisions are eliminated, a valid match has been determined, which can form the basis of compression for that segment of input bytes.

The length of a match, at a minimum, is the length of the fingerprint window. The length of a match, however, can be longer, and should be maximized—longer matches lead to higher compression gain. According to one embodiment, therefore, to detect possible longer matches, the match region is expanded as much as possible, both before and after the two matching fingerprint windows. By way of example, the metadata of the matching fingerprint indicates the location of the fingerprint window in the byte cache, and, on a byte-by-byte bases, the bytes to the left and to the right of the fingerprint window are searched for matches. More specifically, starting with the first byte to the left of the fingerprint window, the byte is compared against the corresponding cached byte—if a match is found, then the match region is expanded by one byte to the left. Similarly, the match region is expanded to the right. This byte-by-byte process continues to expand the match region, in each direction, until (i) no match is found for a next byte in the particular direction, or (ii) the beginning/end of the cache is reached, or (iii) the beginning/end of the input packet is reached, or (iv) based on the mode of operation (per Table 1), whichever occurs first. With respect to the Table 1 mode of operation, (a) if the link is lossless, the match region can expand as long as the expansion is into data from the same stream (either ACK'ed or un-ACK'ed) or ACK'ed data from other streams—when the expansion in a particular direction reaches un-ACK'ed data from other streams, the expansion in that direction is terminated, and (b) if the link is lossy, the match region can expand in each direction, as long as the expansion is into ACK'ed data (regardless of stream)—when the expansion in a particular direction reaches un-ACK'ed data, the expansion in that direction is terminated. After this expansion process is complete, the compressor concludes that a match between a segment of bytes (at least as long as a fingerprint window width) and a segment of bytes stored in the byte cache has been determined. This process ensures that the region of compressor byte cache corresponding to the expanded match will be present in the decompressor cache when the compressed packet is received at the decompressor.

At Step 825, once a match has been conclusively determined, the match region is compressed/replaced with a match descriptor. The MS LRC compressor determines the location of the expanded match segment in the decompressor, and compresses the expanded matched segment of the input packet by replacing it entirely by a corresponding match descriptor, including containing (i) the position of the starting byte of the match in the decompressor byte cache, (ii) the position of the starting byte of the match in the input packet, and (iii) the length of the match. Since the match descriptor can be only a few bytes long, whereas the match segments can be several tens, hundreds or even larger number of bytes, significant compression gains can thus be achieved. The match descriptor is all the information needed by the decompressor to extract the byte segment from its byte cache, enabling the decompressor to accurately reconstruct the original input packet. Further, because an input packet may contain zero or more such match regions, interspersed with literal regions (for which no match was available in the byte cache), each match region is replaced by a match descriptor and the literal bytes remain unmodified. Note that if an optional per-stream second stage compression is employed, then the literal regions can be compressed further by a short range compression method, such as grammar based compression.

At Step 827, once an input packet is compressed, the MS-LRC compressor then stores the input packet in the compressor byte cache. The compressor byte cache is implemented as a contiguous circular byte buffer, with wrap-around occurring only at packet boundaries. When a new input packet is added to the byte cache, the oldest data in the cache is overwritten. If an entire input packet cannot fit at the end of the cache, then a wrap-around occurs and the entire packet is added at the start of the cache, which ensures that input packets are not split during wrap-around at the end of the byte cache, and significantly simplifies cache management and expansion of match regions. Contiguous storage also allows expansion of match regions across (cached) packet boundaries, leading to longer matches and improved compression gain. Further, after an input packet is added to the byte cache, all respective selected fingerprints are added to the hash table along with the metadata. As discussed above, a fingerprint can be stored at one of four possible slots in the hash table. If a new fingerprint matches an existing fingerprint and both belong to the same stream, then the metadata of the new fingerprint overwrites the existing metadata in the respective slot—this ensures that the hash table metadata entry for a fingerprint always points to the newest occurrence of a byte segment in the byte cache. Otherwise, a fingerprint is stored at the first empty slot available among the four possible slots in the hash table, and, if all four slots are occupied, then the fingerprint in the oldest slot is overwritten with the new fingerprint. When the oldest cached packet in the byte cache is overwritten by a new packet, the finger print slots corresponding to the overwritten packet can, for example, be cleared and/or marked as empty.

Figure 8B:
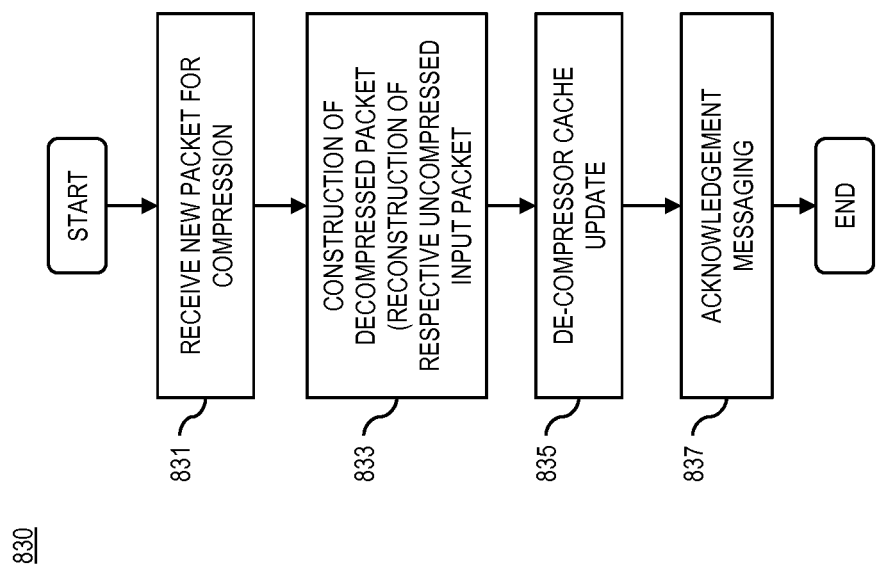
FIG. 8B illustrates a flow chart of a decompression process for a multi-stream long-range data compression/decompression system, in accordance with example embodiments of the invention.

FIG. 8B illustrates a flow chart of a decompression process 830 for a multi-stream long-range data compression/decompression system, in accordance with example embodiments of the invention. At Step 831, the MS-LRDC decompressor receives a new transmitted compressed packet for decompression. At Step 833, the MS-LRDC decompresses the compressed packet (reconstructs the respective uncompressed input packet) based on the match descriptors and literal segments. The packet header conveys the number of match descriptors contained in the received compressed packet, and each match descriptor specifies the locations of the matched bytes in the decompressor byte cache, the length of the match and the location of the match segment in the input packet. By way of example, the decompressor can form/reconstruct the decompressed input packet by (i) copying the matched byte segments from the cache and inserting them in the correct locations of the decompressed packet (as it is being formed/reconstructed), and (ii) copying the literal segments, and inserting them in the respective unfilled gaps of the decompressed packet corresponding to the literal segments, which occur in the compressed packet in exactly the same order as they appeared in the input packet. This completes the construction of a decompressed packet (reconstruction of the corresponding input packet).

At Step 835, the MS-LRDC decompressor updates the decompressor byte cache. The decompressor adds the decompressed packet to the decompressor byte cache, overwriting the oldest bytes, based on the provided location index. The location index indicates the corresponding location in the decompressor byte cache for storage of the resulting decompressed packet. The decompressor determines the location, and stored the decompressed packet in the byte cache at the determined location (possibly leaving gaps in the cache in the case of packets received out-of-order, as discussed above). According to one embodiment, the decompressor byte cache can differ from the compressor byte cache in that stored packets may be stored in a manner wrapping-around the end of the cache, which is permissible because the decompressor does not have to perform match region expansion. In such a case, the compressor will take wrap-around packets into account in determining the match segment locations in the decompressor cache.

At Step 837, if acknowledgement messaging is employed, then the MS-LRC decompressor provides the respective acknowledgment messages to the MS-LRC compressor. The decompressor maintains a list of received packet indices for communication of the acknowledgement messages to the compressor. By way of example, when a higher layer entity requests an acknowledgement message, the packet indices for the packets being acknowledged by the decompressor are encapsulated into an ACK Block, and provided to the higher layer for transmission to the MS-LRC compressor.

Figure 9:
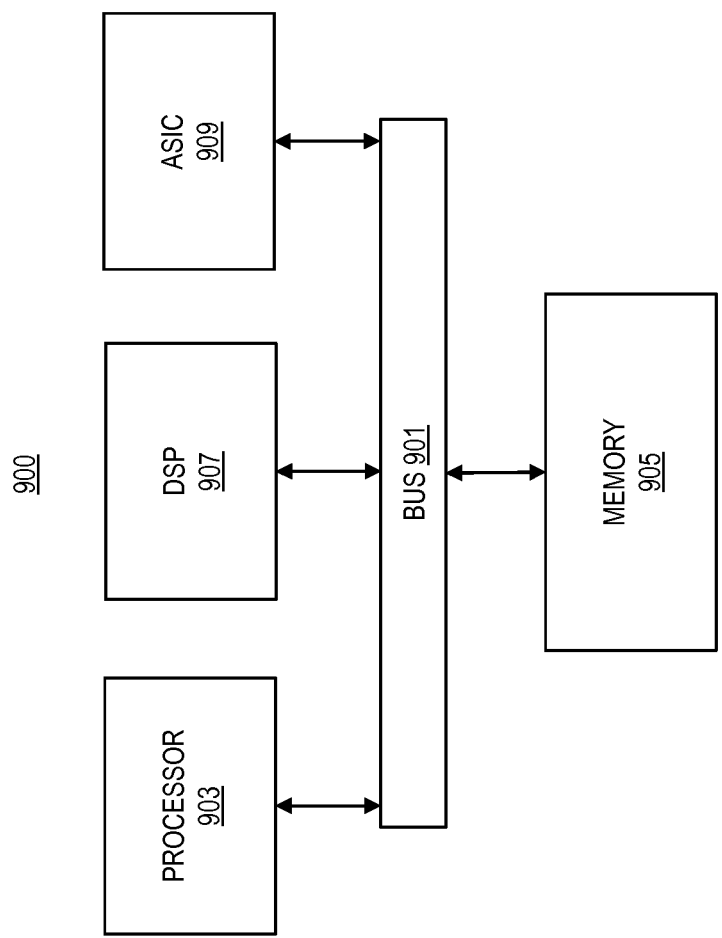
FIG. 9 illustrates a block diagram of a chip set that can be utilized in implementing example embodiments of the present invention.

FIG. 9 illustrates a block diagram of a chip set that can be utilized in implementing example embodiments of the present invention. With reference to FIG. 9, chip set 900 includes, for instance, processor and memory components described with respect to the foregoing example embodiments, and incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 900 includes a communication mechanism such as a bus 901 for passing information among the components of the chip set. A processor 903 has connectivity to the bus 901 to execute instructions and process information stored in, for example, a memory 905. The processor 903 includes one or more processing cores with each core configured to perform independently. A multi-core processor enables multiprocessing within a single physical package. Examples of a multi-core processor include two, four, eight, or greater numbers of processing cores. Alternatively or in addition, the processor 903 includes one or more microprocessors configured in tandem via the bus 901 to enable independent execution of instructions, pipelining, and multithreading. The processor 903 may also be accompanied with one or more specialized components to perform certain processing functions and tasks such as one or more digital signal processors (DSP) 907, and/or one or more application-specific integrated circuits (ASIC) 909. A DSP 907 typically is configured to process real-world signals (e.g., sound) in real time independently of the processor 903. Similarly, an ASIC 909 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 903 and accompanying components have connectivity to the memory 905 via the bus 901. The memory 905 may comprise various forms of computer-readable media, e.g., including both dynamic memory (e.g., RAM) and static memory (e.g., ROM) for storing executable instructions that, when executed by the processor 903 and/or the DSP 907 and/or the ASIC 909, perform the process of example embodiments as described herein. The memory 905 also stores the data associated with or generated by the execution of the process.

The term "computer-readable medium" or "computer-readable media," as used herein, refers to any medium that participates in providing instructions for execution by the processor 903, and/or one or more of the specialized components, such as the one or more digital signal processors (DSP) 907, and/or one or more application-specific integrated circuits (ASIC) 909. Such a medium may take many forms, including but not limited to non-volatile media, volatile media, and transmission media. Non-volatile media include, for example, read only memory (ROM), included within memory 905. Volatile media, for example, may include dynamic random access memory (RAM), included within memory 905. Transmission media may include copper or other conductive wiring, fiber optics, or other physical transmission media, including the wires and/or optical fiber that comprise bus 901. Transmission media can also take the form of wireless data signals, such as those generated during radio frequency (RF) and infrared (IR) data communications. Common forms of computer-readable media include, for example, magnetic storage media (e.g., magnetic hard disks or any other magnetic storage medium), solid state or semiconductor storage media (e.g., RAM, PROM, EPROM, FLASH EPROM, a data storage device that uses integrated circuit assemblies as memory to store data persistently, or any other storage memory chip or module), optical storage media (e.g., CD ROM, CDRW, DVD, or any other optical storage medium), a or any other medium for storing data from which a computer or processor can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Moreover, as will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

FIG. 10 illustrates a block diagram of a computer system that can be utilized in implementing example embodiments of the present invention. The computer system 1000 includes a bus 1001 or other communications mechanism for communicating information, and a processor 1003 coupled to the bus 1001 for processing information. The processor may comprise one or more of various types of general processors, and/or one or more specialized components (not shown), such as the one or more digital signal processors (DSPs) and/or one or more application-specific integrated circuits (ASICs). The computer system 1000 also includes main memory 1005, such as a random access memory (RAM) or other dynamic storage device, coupled to the bus 1001 for storing information and instructions to be executed by the processor 1003. Memory 1005 can also be used for storing temporary variables or other intermediate information during execution of instructions to be executed by the processor 1003. The computer system 1000 further includes a read only memory (ROM) 1007 or other static storage device coupled to the bus 1001 for storing static information and instructions for the processor 1003. A storage device 1009, such as a magnetic disk or optical disk, is additionally coupled to the bus 1001 for storing information and instructions.

The computer system 1000 can be coupled via the bus 1001 to a display 1011, such as a cathode ray tube (CRT), liquid crystal display, active matrix display, or plasma display, for displaying information to a computer user. An input device 1013, such as a keyboard including alphanumeric and other keys, is coupled to the bus 1001 for communicating information and command selections to the processor 1003. Another type of user input device is cursor control 1015, such as a mouse, a trackball, or cursor direction keys for communicating direction information and command selections to the processor 1003 and for controlling cursor movement on the display 1011.

According to aspects of the invention, dynamic and flexible architectures, apparatus and methods for implementing load balancing for traffic loads for multiple priorities, in accordance with example embodiments, are provided by the computer system 1000 in response to the processor 1003 executing an arrangement of instructions contained in main memory 1005. Such instructions can be read into main memory 1005 from another computer-readable medium, such as the storage device 1009. Execution of the arrangement of instructions contained in main memory 1005 causes the processor 1003 to perform the process steps described herein. One or more processors in a multi-processing arrangement can also be employed to execute the instructions contained in main memory 1005. In alternative embodiments, hard-wired circuitry can be used in place of or in combination with software instructions to implement embodiments and aspects of the invention. Thus, embodiments of the present invention are not limited to any specific combination of hardware circuitry and software.

The computer system 1000 also includes a communications interface 1017 coupled to bus 1001. The communications interface 1017 provides a two-way data communications, such as coupling to a network link 1019 connected to a local network 1021 or to or from remote terminals or controllers of communications systems. For example, the communications interface 1017 can be a digital subscriber line (DSL) card or modem, an integrated services digital network (ISDN) card, a cable modem, or a telephone modem to provide a data communications connection to a corresponding type of telephone line. As another example, communications interface 1017 can be a local area network (LAN) card (e.g., for Ethernet or an Asynchronous Transfer Model (ATM) network) to provide a data communications connection to a compatible LAN. Wireless links, such as for satellite communications systems, can also be implemented. In any such implementation, communications interface 1017 sends and receives electrical, electromagnetic, or optical signals that carry digital data streams representing various types of information. Further, the communications interface 1017 can include peripheral interface devices, such as a Universal Serial Bus (USB) interface, a PCMCIA (Personal Computer Memory Card International Association) interface, etc.

The network link 1019 typically provides data communications through one or more networks to other data devices. For example, the network link 1019 can provide a connection through local network 1021 to a host computer 1023, which has connectivity to a network 1025 (e.g., a wide area network (WAN) or the global packet data communications network now commonly referred to as the "Internet") or to data equipment operated by service provider. The local network 1021 and network 1025 both use electrical, electromagnetic, or optical signals to convey information and instructions. The signals through the various networks and the signals on network link 1019 and through communications interface 1017, which communicate digital data with computer system 1000, are example forms of carrier waves bearing the information and instructions.

The computer system 1000 can send messages and receive data, including program code, through the network(s), network link 1019, and communications interface 1017. In the Internet example, a server (not shown) can transmit requested code belonging to an application program for implementing an embodiment of the present invention through the network 1025, local network 1021 and communications interface 1017. The processor 1003 can execute the transmitted code while being received and/or store the code in storage device 1009, or other non-volatile storage for later execution. In this manner, computer system 1000 can obtain application code in the form of a carrier wave.

While example embodiments and aspects of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention, as set forth in the claims that follow. The specification and drawings are accordingly to be regarded in an illustrative rather than restrictive sense.

What is claimed is:

1. A method for multi-stream data compression, comprising:

receiving, by a long-range decompressor device, a sequence of packets of a transmitted data stream via a channel of a communications network, wherein the sequence of packets originates from a compression process applied to data blocks of a one source data stream prior to transmission of the packets, the compression process having been applied in a successive order of compression of the data blocks, and the packets having been transmitted in a transmission order matching the successive order of compression, and wherein each packet of the sequence of packets reflects a compressed version of a respective data block of the one source data stream;

applying a decompression process with respect to a one packet of the sequence of packets to generate a decompressed version of the respective data block of the one source data stream, and determining whether the one packet has been received in a proper reception order that matches the successive order of compression;

in a circumstance when it is determined that the one packet has been received in the proper reception order, storing the decompressed version of the one packet at a respective next location in a decompressor data cache; and in a circumstance when it is determined that the one packet has been received prior to one or more packets of the sequence of packets that reflect compressed version(s) of respective data block(s) of the one source data stream that were compressed prior to the respective data block reflected by the one packet, determining a respective storage location for storage of the decompressed version of the one packet in the decompressor data cache that leaves appropriate storage space for the one or more packets that reflect compressed version(s) of respective data block(s) that were compressed prior to the respective data block reflected by the one packet, and storing the decompressed version of the one packet at the determined respective storage location in the decompressor cache.

2. The method of claim 1, wherein the source data stream consists of one of a plurality of source data streams of differing priority levels, and the compression process having been applied to the data blocks of the one source data stream on an aggregate basis using a common compressor data cache among the plurality of data streams.

3. The method of claim 1, wherein:

the decompressor data cache is larger in size, by a cache extension of X bits, than a corresponding compressor data cache based on which the compression process was applied to the data blocks of the one source data stream;

the cache extension facilitates application of the decompression process on a packet that has not been received in the proper reception order; and a range of compressor cache data available at a time of application of the compression process to the respective data block reflected by the one packet remains present in the decompressor data cache for decompression of the one packet, provided that the one packet has not been delayed beyond a maximum degree based on the X bit length of the cache extension.

4. The method of claim 1, wherein, based on the compression process, each packet of the sequence of packets is received together with a location index indicating a respective location within the decompressor data cache for storage of the a respective decompressed version of the packet.

5. The method of claim 4, wherein a range of the location index is maximized by basing the index on a decompressor data cache size that is an integer (M) times the decompressor data cache size ($B_d$), and wherein the respective location in the decompressor cache for storage of the respective decompressed version of the packet is determined as the location index modulo $B_d$.

6. The method of claim 4, wherein the location index directly specifies the respective location within the decompressor cache for storage of the respective decompressed version of the packet.

7. The method of claim 4, wherein, when it is determined that the one packet has been received prior to the one or more packets that reflect compressed version(s) of respective data block(s) that were compressed prior to the respective data block reflected by the one packet, the respective storage location for storage of the decompressed version of the one packet in the decompressor data cache is determined based on the respective location index received with the one packet.

8. The method of claim 7, wherein the location index received with the one packet is based on the length and compression order of the data block of the one source data stream and on the decompressor cache size.

9. The method of claim 7, further comprising:
generating a return acknowledgment message corresponding to each packet of the transmitted data stream, wherein each return acknowledgment message provides an identification of the corresponding packet based on the location index received with that packet.

10. The method of claim 9, further comprising:
periodically transmitting a block of acknowledgment messages corresponding to a respective plurality of received packets of the transmitted data stream at respective intervals of time.

11. An apparatus for multi-stream data compression, comprising:
a long-range decompressor configured to receive a sequence of packets of a transmitted data stream, wherein the sequence of packets originates from a compression process applied to data blocks of a one source data stream prior to transmission of the packets, the compression process having been applied in a successive order of compression of the data blocks, and the packets having been transmitted in a transmission order matching the successive order of compression, and wherein each packet of the sequence of packets reflects a compressed version of a respective data block of the one source data stream; and
a decompressor data cache; and
wherein the long-range decompressor is further configured to apply a decompression process with respect to a one packet of the sequence of packets to generate a decompressed version of the respective data block of the one source data stream, and to determine whether the one packet has been received in a proper reception order that matches the successive order of compression;
wherein, in a circumstance when it is determined that the one packet has been received in the proper reception order, the long-range decompressor is further configured to store the decompressed version of the one packet at a respective next location in the decompressor data cache; and
wherein, in a circumstance when it is determined that the one packet has been received prior to one or more packets of the sequence of packets that reflect compressed version(s) of respective data block(s) of the one source data stream that were compressed prior to the respective data block reflected by the one packet, the long-range decompressor is further configured to determine a respective storage location for storage of the decompressed version of the one packet in the decompressor data cache that leaves appropriate storage space for the one or more packets that reflect compressed version(s) of respective data block(s) that were compressed prior to the respective data block reflected by the one packet, and to store the decompressed version of the one packet at the determined respective storage location in the decompressor cache.

12. The apparatus of claim 11, wherein the source data stream consists of one of a plurality of source data streams of differing priority levels, and the compression process having been applied to the data blocks of the one source data stream on an aggregate basis using a common compressor data cache among the plurality of data streams.

13. The apparatus of claim 11, wherein:
the decompressor data cache is larger in size, by a cache extension of X bits, than a corresponding compressor data cache based on which the compression process was applied to the data blocks of the one source data stream;
the cache extension facilitates application of the decompression process on a packet that has not been received in the proper reception order; and
a range of compressor cache data available at a time of application of the compression process to the respective data block reflected by the one packet remains present in the decompressor data cache for decompression of the one packet, provided that the one packet has not been delayed beyond a maximum degree based on the X bit length of the cache extension.

14. The apparatus of claim 11, wherein, based on the compression process, each packet of the sequence of packets is received together with a location index indicating a respective location within the decompressor data cache for storage of the a respective decompressed version of the packet.

15. The apparatus of claim 14, wherein the location index directly specifies the respective location within the decompressor cache for storage of the respective decompressed version of the packet.

16. The apparatus of claim 14, wherein, when it is determined that the one packet has been received prior to the one or more packets that reflect compressed version(s) of respective data block(s) that were compressed prior to the respective data block reflected by the one packet, the respective storage location for storage of the decompressed version of the one packet in the decompressor data cache is determined based on the respective location index received with the one packet.

17. The apparatus of claim 16, wherein the location index received with the one packet is based on the length and compression order of the data block of the one source data stream and on the decompressor cache size.

18. The apparatus of claim 16, wherein the long-range decompressor is further configured to generate a return acknowledgment message corresponding to each packet of the transmitted data stream, wherein each return acknowledgment message provides an identification of the corresponding packet based on the location index received with that packet.

19. The apparatus of claim 18, wherein the long-range decompressor is further configured to periodically transmit a block of acknowledgment messages corresponding to a respective plurality of received packets of the transmitted data stream at respective intervals of time.

20. The apparatus of claim 19, wherein a range of the location index is maximized by basing each location index on a decompressor data cache size that is an integer (M) times the decompressor data cache size ($B_d$), and wherein the respective location in the decompressor cache for storage of the respective decompressed version of the packet is determined as the location index modulo $B_d$.

* * * * *